US00RE39846E

(19) United States
(12) Reissued Patent
Tanitsu et al.

(10) Patent Number: US RE39,846 E
(45) Date of Reissued Patent: Sep. 18, 2007

(54) ILLUMINATION OPTICAL APPARATUS AND SCANNING EXPOSURE APPARATUS

(75) Inventors: Osamu Tanitsu, Funabashi (JP); Takashi Mori, Fujisawa (JP); Noriaki Yamamoto, Yokohama (JP)

(73) Assignee: Nikon Corporation, Tokyo (JP)

(21) Appl. No.: 09/326,214

(22) Filed: Jun. 3, 1999

Related U.S. Patent Documents

Reissue of:
(64) Patent No.: 5,636,003
Issued: Jun. 3, 1997
Appl. No.: 08/365,532
Filed: Dec. 28, 1994

U.S. Applications:
(63) Continuation-in-part of application No. 08/147,259, filed on Nov. 4, 1993, now abandoned.

(30) Foreign Application Priority Data

Nov. 5, 1992 (JP) ..... 4-295458
Feb. 5, 1993 (JP) ..... 5-019098
Mar. 23, 1994 (JP) ..... 6-051490

(51) Int. Cl.
*G03B 27/54* (2006.01)
*G03B 27/42* (2006.01)
*G02B 27/08* (2006.01)
*H01L 21/027* (2006.01)

(52) U.S. Cl. ..... 355/67; 355/53; 359/618
(58) Field of Classification Search ..... 355/53, 355/67, 70; 359/618, 619; 362/268
See application file for complete search history.

(56) References Cited

U.S. PATENT DOCUMENTS 4,497,015 A 1/1985 Konno et al. ..... 362/268
4,619,508 A 10/1986 Shibuya et al. ..... 353/122
4,918,583 A 4/1990 Kudo et al.
4,924,257 A 5/1990 Jain
4,939,630 A 7/1990 Kikuchi et al. ..... 362/268
5,194,893 A * 3/1993 Nishi ..... 355/53
5,237,367 A 8/1993 Kudo ..... 355/67
5,245,384 A 9/1993 Mori ..... 355/67
5,253,110 A 10/1993 Ichihara et al. ..... 359/619
5,296,892 A 3/1994 Mori ..... 355/67
5,307,207 A 4/1994 Ichihara
5,335,044 A * 8/1994 Shiraishi ..... 355/53
5,459,547 A 10/1995 Shiozawa ..... 355/67
5,638,211 A 6/1997 Shiraishi
5,684,567 A 11/1997 Shiozawa
5,719,704 A * 2/1998 Shiraishi et al. ..... 355/53

FOREIGN PATENT DOCUMENTS

JP A-61-91662 5/1986
JP A-62-2540 1/1987
JP A-62-115718 5/1987
JP A-1-259533 10/1989
JP A-1-311502 12/1989
JP A-2-48627 2/1990
JP A-6-45221 2/1994

* cited by examiner

*Primary Examiner*—Alan Matthews
(74) *Attorney, Agent, or Firm*—Oliff & Berridge, PLC

(57) ABSTRACT

An illumination optical apparatus for illuminating an object to be illuminated in an arcuate or rectangular shape. A first optical integrator forms a plurality of light source images in a substantially linear arrangement, based on a beam of parallel rays. Then a second optical integrator forms a plurality of light source images in a substantially square arrangement, based on the beam from the first optical integrator. A relay optical system is disposed between the first and second optical integrator, and makes a position of the light source images formed by the first optical cintegrator conjugate with a position of the light source images formed by the second optical integrator.

104 Claims, 19 Drawing Sheets

ILLUMINATION OPTICAL APPARATUS AND SCANNING EXPOSURE APPARATUS

Matter enclosed in heavy brackets [ ] appears in the original patent but forms no part of this reissue specification; matter printed in italics indicates the additions made by reissue.

RELATED APPLICATIONS

This is a continuation-in-part application of application Ser. No. 08/147,259 filed on Nov. 4, 1993, now abandoned.

BACKGROUND OF THE INVENTION

1. Field of the Invention

The present invention relates to an illumination optical apparatus for illuminating an object to be illuminated in an arcuate or rectangular shape. More particularly, the invention relates to an illumination optical apparatus suitable for applications in exposure apparatus for fabrication of semiconductors and to a scanning exposure apparatus using it.

2. Related Background Art

An example of conventional illumination optical apparatus of such type is what is disclosed in U.S. Pat. No. 4,497,015 issued to Konno et al. The apparatus as disclosed has a plurality of optical integrators arranged between a point source of light and an object to be illuminated, by which a uniform intensity distribution can be obtained on the exit plane of the last optical integrator.

On the other hand, there is a scanning exposure method recently proposed, in which a rectangular or arcuate beam is formed to illuminate a reticle and in which the reticle and a wafer disposed conjugate with each other with respect to a projection optical system are moved in a certain direction, whereby a circuit pattern on the reticle is duplicated on the wafer with high throughput.

Since this scanning exposure method requires uniform illumination in a rectangular or arcuate area, an illumination optical apparatus which can obtain uniform illumination is such an area is required.

SUMMARY OF THE INVENTION

It is an object of the present invention to provide a high-performance illumination optical apparatus which enables arcuate or rectangular uniform illumination on a surface to be illuminated at high illumination efficiency and without loss in quantity of light.

The above object and other objects will be further apparent from the following description.

Provided according to the present invention is an illumination optical apparatus comprising a light supply means for supplying a beam, a light-source-image forming means for forming a plurality of light source images in a substantially linear arrangement, based on the beam from said light supply means, an optical integrator having a plurality of lens elements for forming a plurality of light source images in a substantially square arrangement, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof, and a relay optical system disposed between said light-source-image forming means and said optical integrator, for making a position of the light source images formed by said light-source-image forming means conjugate with a position of the light source images formed by said optical integrator.

Also provided according to the present invention in an illumination optical apparatus comprising a light supply means for supplying a beam, a light-source-image forming means for forming a plurality of light source images in a substantially linear arrangement, based on the beam from said light supply means, an internal reflection type integrator having two reflection planes parallel to each other for forming a plurality of light source images in a substantially square arrangement, based on the beam from said light-source-image forming means, said internal reflection type integrator having a rectangular cross section, two sides adjacent to each other of said rectangular cross section being different in length, and a relay optical system disposed between said light-source-image forming means and said internal reflection type integrator, for making a position of the light source images formed by said light-source-image forming means conjugate with a position of the light source images formed by said internal reflection type integrator.

Further provided according to the present invention is a scanning exposure apparatus comprising a light supply means for supplying a beam, a light-source-image forming means for forming a plurality of light source images in a substantially linear arrangement, based on the beam from said light supply means, an optical integrator having a plurality of lens elements for forming a plurality of light source images in a substantially square arrangement, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof, a relay optical system disposed between said light-source-image forming means and said optical integrator, for making a position of the light source images formed by said light-source-image forming means conjugate with a position of the light source images formed by said optical integrator, a condenser optical system for condensing the beam from said optical integrator to illuminate a surface of a reticle, a reticle stage for moving said reticle in a direction parallel to said surface of reticle, a wafer stage for carrying a wafer on which integrated circuits are to be formed, and moving said wafer in a direction parallel to a surface of said wafer, and a projection optical system disposed between said reticle and said wafer, for making a position at which said reticle is located conjugate with a position at which said wafer is located.

Also provided according to the present invention is a scanning exposure apparatus comprising a light supply means for supplying a beam, a light-source-image forming means for forming a plurality of light source images in a substantially linear arrangement, based on the beam from said light supply means, an internal reflection type integrator having two reflection planes parallel to each other for forming a plurality of light source images in a substantially square arrangement, based on the beam from said light-source-image forming means, said internal reflection type integrator having a rectangular cross section, two sides adjacent to each other of said rectangular cross section being different in length, a relay optical system disposed between said light-source-image forming means and said internal reflection type integrator, for making a position of the light source images formed by said light-source-image forming means conjugate with a position of the light source images formed by said internal reflection type integrator, a condenser optical system for condensing the beam from said internal reflection type integrator to illuminate a surface of a reticle, a reticle stage for moving said reticle in a direction parallel to said surface of reticle, a wafer stage for carrying a wafer on which integrated circuits are to be formed, and moving said wafer in a direction parallel to a surface of said wafer, and a projection optical system disposed between said reticle and said wafer, for making a position at which said reticle is located conjugate with a position at which said wafer is located.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

The present invention will be described in detail with preferred embodiments thereof with reference to the accompanying drawings.

Embodiment 1

Figure 1:
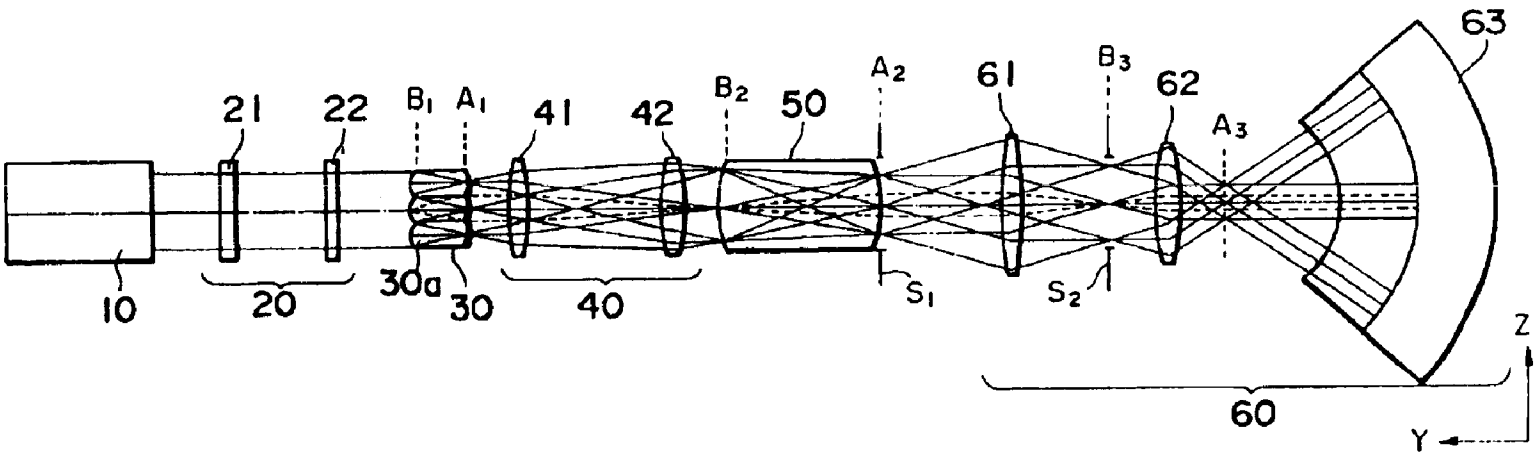
FIG. 1 is a plan view to show the first embodiment of illumination optical apparatus.
Figure 2:
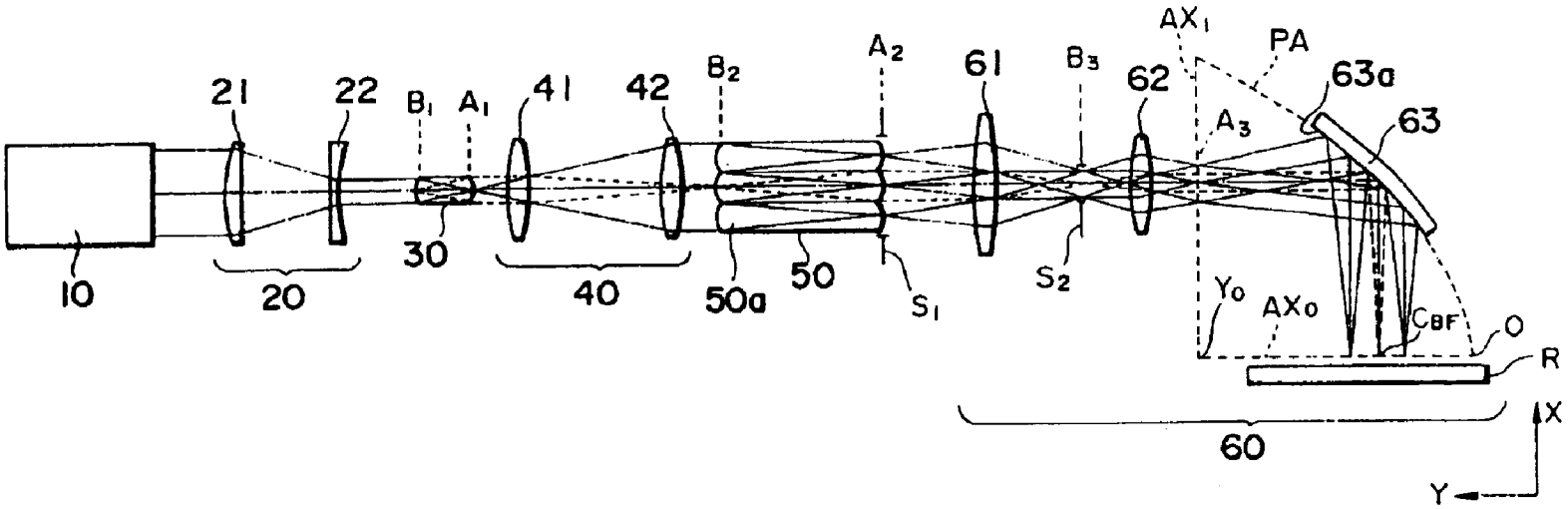
FIG. 2 is a side view to show the first embodiment of illumination optical apparatus.
Figure 3:
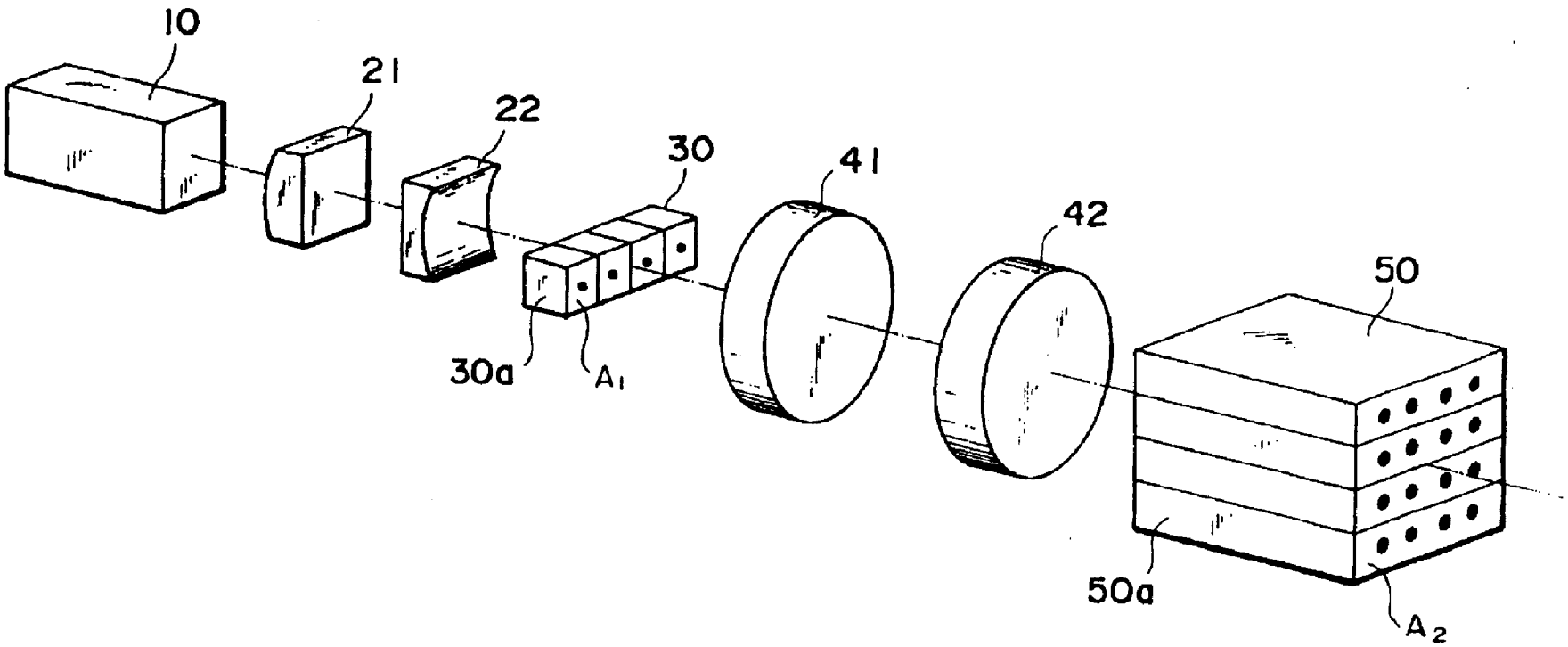
FIG. 3 is a perspective view to show some of constituent elements in the first embodiment of illumination optical apparatus.

FIGS. 1 and 2 show an example in which the first embodiment of illumination optical apparatus is applied to an exposure apparatus for fabrication of semiconductors. FIG. 1 is a plan view of the first embodiment as seen from immediately above the apparatus, and FIG. 2 is a side view thereof as seen from the side thereof. Also, FIG. 3 is a perspective view to show some of constituent elements in the apparatus of first embodiment. The number of lens elements 30a, 50a is three in FIGS. 1 and 2 while it is four in FIG. 3. However, the difference is not essential.

The first embodiment will be described in detail with reference to FIGS. 1 to 3.

As shown in FIGS. 1 and 2, light supplying means for supplying a beam of parallel rays with rectangular beam section is composed of a parallel beam supplying portion 10 and a beam shaping portion 20. The parallel beam supplying portion is a light source 10 such as an excimer laser, which emits a beam of parallel rays with wavelength of 248 nm (KrF) or 192 nm (ArF). The beam of parallel rays has a rectangular cross section. The parallel beam from the light source 10 enters a beam shaping optical system 20, which is the beam shaping portion for shaping the beam into one with a predetermined cross section. The beam shaping optical system 20 is composed of two cylindrical lenses 21, 22 each having a refracting power in the direction normal to the plane of FIG. 1 (i.e., the direction parallel to the plane of FIG. 2). The cylindrical lens 21 on the light source side has a positive refracting power, which focuses the beam in the direction parallel to the plane of FIG. 2. In contrast, the cylindrical lens 22 on the object side has a negative refracting power, which changes the focused beam from the cylindrical lens 21 on the light source side into a beam of parallel rays while making it diverged. Thus, the beam of parallel rays from the light source 1 is shaped through the beam shaping optical system 20 such that the beam width is reduced in the direction parallel to the plane of FIG. 2 so as to make the cross section of beam rectangular. The beam shaping optical system 20 may be replaced by a combination of cylindrical lenses having a positive refracting power, or an anamorphic prism.

The thus shaped beam from the beam shaping optical system 20 enters an optical integrator 30 as light-source-image forming means, which forms a plurality of images of light source linearly aligned. The optical integrator 30 is so arranged as shown in FIG. 1 that a plurality of (three in FIG. 1) double-convex lens elements 30a each having a lens cross section of substantial square are arranged in line along the direction parallel to the plane of FIG. 1. The optical integrator 30 has a rectangular cross section as a whole. Each double-convex lens elements 30a has a same curvature (refracting power) both in the direction parallel to the plane of FIG. 1 and in the direction parallel to the plane of FIG. 2.

As the parallel beam passes through each lens element 30a in the optical integrator 30, it is focused as shown by the solid lines in FIGS. 1 and 2 to form an image of light source on the exit side of each lens element 30a. Accordingly, there are a plurality of (three in FIG. 1) light source images formed linearly (in line) corresponding to the number of lens elements 30a, at an exit plane position $A_1$ of the optical integrator 30, where secondary light sources are substantially formed.

FIG. 3 shows a plurality of (four in this case) light source images formed at the exit plane position $A_1$ of the optical integrator 30.

In FIGS. 1 and 2 the solid lines represent rays having the conjugate relation to form the light source images, as described above. Also, the dotted lines in FIGS. 1 and 2 represent rays having the conjugate relation with an area to be illuminated.

The beams from the secondary light sources, which are formed by the optical integrator 30 as linearly aligned, are converged by a relay optical system 40 and then enter an optical integrator 50, which forms a plurality of light source images arranged in rectangular shape.

The relay optical system 40 is composed of a first relay lens 41 arranged such that the front focus position thereof is coincident with the exit plane position $A_1$ of the optical integrator 30, and a second relay lens 42 which converges the beam from the first relay lens 41 to form a beam of parallel rays at an entrance plane position $B_2$ of the optical integrator 50.

The relay optical system 40 makes the entrance plane position $B_1$ of the optical integrator 30 conjugate with an entrance plane position $B_2$ of the optical integrator 50, and the exit plane position $A_1$ of the optical integrator 30 conjugate with an exit plane position $A_2$ of the optical integrator 50.

The optical integrator 50 is composed, as shown in FIG. 1, of a plurality of double-convex lens elements 50a each having a rectangular lens cross section, which are arranged in line along the direction parallel to the plane of FIG. 2. Each lens element 50a is formed such that a cross section (ratio of height to width) of the lens element 50a is similar to that of the optical integrator 30. The optical integrator 50 has a square cross section as a whole. Also, each lens element 50a has a same curvature (refracting power) both in the direction parallel to the plane of FIG. 1 and in the direction parallel to the plane of FIG. 2. Then, as the beams from the optical integrator 30 pass through the lens elements 50a constituting the optical integrator 50, they are converged to form images of light source on the exit side of the lens elements 50a. Accordingly, a plurality of light source images are formed in a square arrangement at the exit plane position $A_2$ of the optical integrator 50, where tertiary light sources are substantially formed.

Here, the number of plural light source images formed in the square arrangement by the optical integrator 50 is N×M, where the number of lens elements 30a constituting the optical integrator 30 is N and the number of lens elements 50a constituting the optical integrator 50 is M. In more detail, the plural light source images to be formed by the optical integrator 30 are guided through the relay optical system 40 to be focused at the position of light source image of each lens element 50a in the optical integrator 50, forming N×M light source images in total at the exit plane position $A_2$ of the optical integrator 50.

FIG. 3 shows the plural (4×4=16 in this case) light source images formed at the exit plane position of the optical integrator 50.

In FIGS. 1 and 2, an aperture stop $S_1$ is provided at the position $A_2$ where the tertiary light sources are formed. The aperture stop $S_1$ has a circular aperture inscribed to the cross section of optical integrator 50. The beams from the tertiary light sources shaped in circle by the aperture stop $S_1$ are converged by a condenser optical system 60 to uniformly illuminate a reticle R as an object to be illuminated in the shape of arc.

The condenser optical system 60 has a relay optical system 61, 62 for relaying the tertiary light sources and an optical reflector 63 for focusing the beams from the tertiary light source images relayed by the relay optical system 61, 62 to directly form an arcuate illumination area on the reticle R.

First, the relay optical system 61, 62 is composed of a first relay lens 61 a front focus position of which coincides with the exit plane position $A_2$ of the optical integrator 50, and a second relay lens 62 which converges the beams from the first relay lens 61 to form light source images at a rear focus position $A_3$. A field stop $S_2$ is provided at a rear focus position $B_3$ of the first relay lens 61. The field stop $S_2$ has a rectangular or substantially rectangular aperture for accurately defining the illumination area on the reticle R.

The optical reflector 63 is arcuate as a whole, as shown in FIGS. 1 and 2, and has a reflective surface 63a having a predetermined curvature. Specifically, the reflective surface 63a is a part of paraboloidtoric body of revolution obtained by rotating a parabola PA about a base axis $Ax_1$ passing through a point $Y_0$ distant at a certain distance along the symmetry axis $Ax_0$ of the parabola PA from the vertex O thereof and perpendicular to the symmetry axis $Ax_0$. The details about the optical reflector 63 are described in the co-pending U.S. Patent Application which was filed to the USPTO on Sep. 10, 1993 and assigned to NIKON CORPORATION.

Here, let the origin be at the vertex O of the parabola PA forming the reflective surface 63a, the Y axis be the symmetry axis $Ax_0$ coincident with the plane to be illuminated (reticle R), the X axis be the axis perpendicular to the plane to be illuminated (reticle R), and the equation $Y=\alpha x^2$ (where $\alpha$ is a constant) define the parabola PA forming the reflective surface 63a, as shown in FIG. 2. Then the base axis $Ax_1$ passes through the point $Y_0$ on the symmetry axis $Ax_0$ $3/(4\alpha)$ distant from the origin O. The center of light source images of the optical integrator 50, which are re-imaged through the relay optical system 61, 62, is formed at a position on the base axis $Ax_1$ $1/(2\alpha)$ distant from the point $Y_0$.

Consequently, beams from the center position of light source images of the optical integrator 50, which are re-imaged by the relay optical system 61, 62, are converted into parallel beams having an arcuate beam cross section by the focusing effect of the optical reflector 63, whereby an arcuate illumination area passing through the point on the symmetry axis $Ax_0$ $1/(4\alpha)$ distant from the origin O is formed on the reticle R.

Quantitatively analyzing the shape of the reflective surface 63a of the optical reflector 63, the optical reflector 63 is preferably formed by a part of the paraboloid-toric body of revolution satisfying the following relations of Equations (1) and (2).

$$\left(y-\frac{3}{4\alpha}\right)^2+2^2=\left(\frac{3}{4\alpha}-\alpha x^2\right)^2,\ 0\le \times \le \frac{3^{R3}}{2\alpha} \tag{1}$$

$$r=\frac{3}{4\alpha} \tag{2}$$

In the above equations, x, y, z are coordinates, if the origin is set at the vertex O of the parabola PA ($y=\alpha x^2$) forming the reflective surface 63a, the X axis in the direction perpendicular to the illuminated surface, the Y axis in the direction coincident with the symmetry axis $Ax_0$, and the Z axis in the direction perpendicular to the base axis $Ax_1$ and to the symmetry axis $Ax_0$. Also, r represents a distance from an intersection $Y_o$ between the base axis $Ax_1$ and the symmetry axis $Ax_0$ to the vertex O of the parabola PA ($y=\alpha x^2$) forming the reflective surface 63a.

When the above relations of Equations (1) and (2) are satisfied, the optical reflector 63 converts the beams diverging from the light source images formed at the position $A_3$ into parallel beams having an arcuate beam section, which form an arcuate illumination area maintaining the telecentricity and the Köhler illumination condition.

The coordinates of the center of light source images formed at the position $A_3$ are $(1/(2\alpha), 3/(4\alpha), 0)$, and the center $C_{BF}$ Of the illuminated area shown in FIG. 2 falls on a circle in the YZ plane expressed by Equation (3) as described below.

$$\left(y-\frac{3}{4\alpha}\right)^2+z^2=\left(\frac{1}{2\alpha}\right)^2 \tag{3}$$

The condenser optical system as so arranged can directly form the arcuate illumination area on the reticle R without a loss in quantity of light and at high illumination efficiency.

Figure 4:
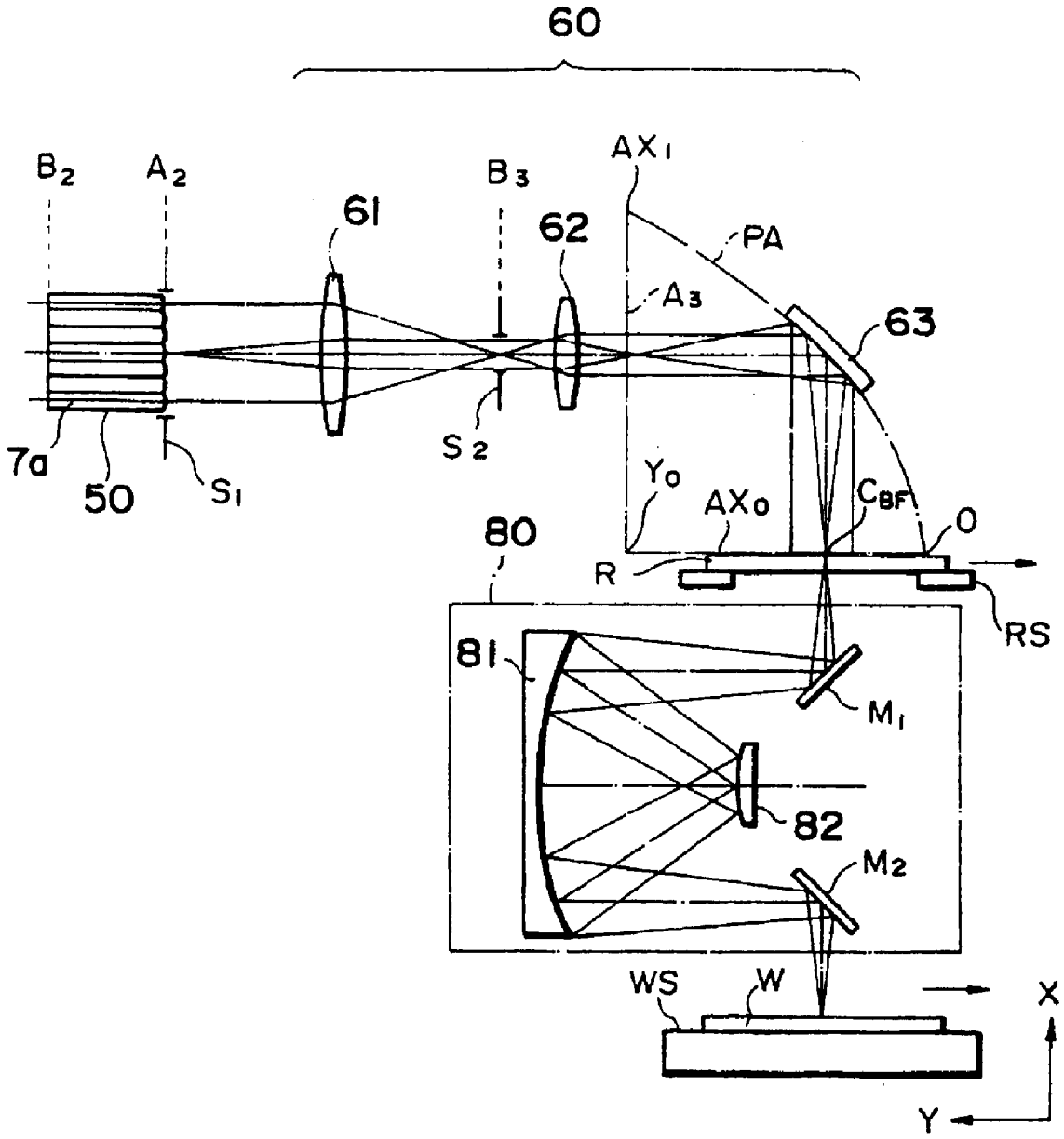
FIG. 4 is a side view of a projection exposure section for replication of circuit pattern on reticle R onto a wafer W, using the first embodiment of illumination optical apparatus.

Next described referring to FIG. 4 is the replication of circuit pattern on the reticle R onto the wafer W, using the illumination optical apparatus shown in FIGS. 1 and 2.

FIG. 4 shows the structure of a projection exposure section which duplicates the circuit pattern on the reticle R onto the wafer W, using the illumination optical apparatus shown in FIGS. 1 and 2.

As shown in FIG. 4, the reticle R held by the reticle stage RS is conjugate with the wafer W mounted on the wafer stage WS with respect to a projection optical system 80, so that an arc-illuminated portion in the circuit pattern on the reticle R is projected through the projection optical system 80 onto the wafer W by the focusing effect of the optical reflector 63.

The projection optical system 80 has a concave mirror 81 and a convex mirror 82 as basic elements, which are arranged such that the center of curvature of the concave mirror 81 is almost coincident with that of the convex mirror 82. Further, reflection mirrors $M_1$, $M_2$ are provided between the reticle R and the concave mirror 81 and between the concave mirror 81 and the wafer W, respectively, to bend the optical path.

An entrance pupil of the projection optical system 80 is located in the vicinity of the convex mirror 82 so that the entrance pupil is conjugate with the light source images formed by the second relay lens 62 in the relay optical system. The so-called Köhler illumination is thus realized, because the light source images formed by the illumination optical system disposed above the reticle are formed at the entrance pupil of projection optical system 80.

In actual exposure using the illumination optical apparatus constructed as described above, as the reticle stage RS and the wafer stage WS are moved in the direction of arrows, the circuit pattern on the reticle is transferred onto the wafer W. Since the circuit pattern on the reticle is uniformly illuminated in the arcuate shape at high illumination efficiency, scanning exposure can be realized at remarkably higher throughput than in conventional procedure.

Although the first embodiment shown in FIGS. 1 and 2 employs the excimer laser as the parallel beam supplying portion for supplying the beam of parallel rays, the invention is not limited to the excimer laser. For example, the parallel beam supplying portion may be constructed by using a mercury-arc lamp emitting light of g-line (436 nm) or i-line (365 nm), an ellipsoidal mirror for collecting light from the mercury-arc lamp, and a collimator lens system for converting the thus collected beam into a beam of parallel rays (see FIG. 6). Also, although the present embodiment is arranged with projection optical system 80 being of a reflection type, it is a matter of course that the projection optical system 80 can be constructed as a refraction system.

Embodiment 2

Figure 5:
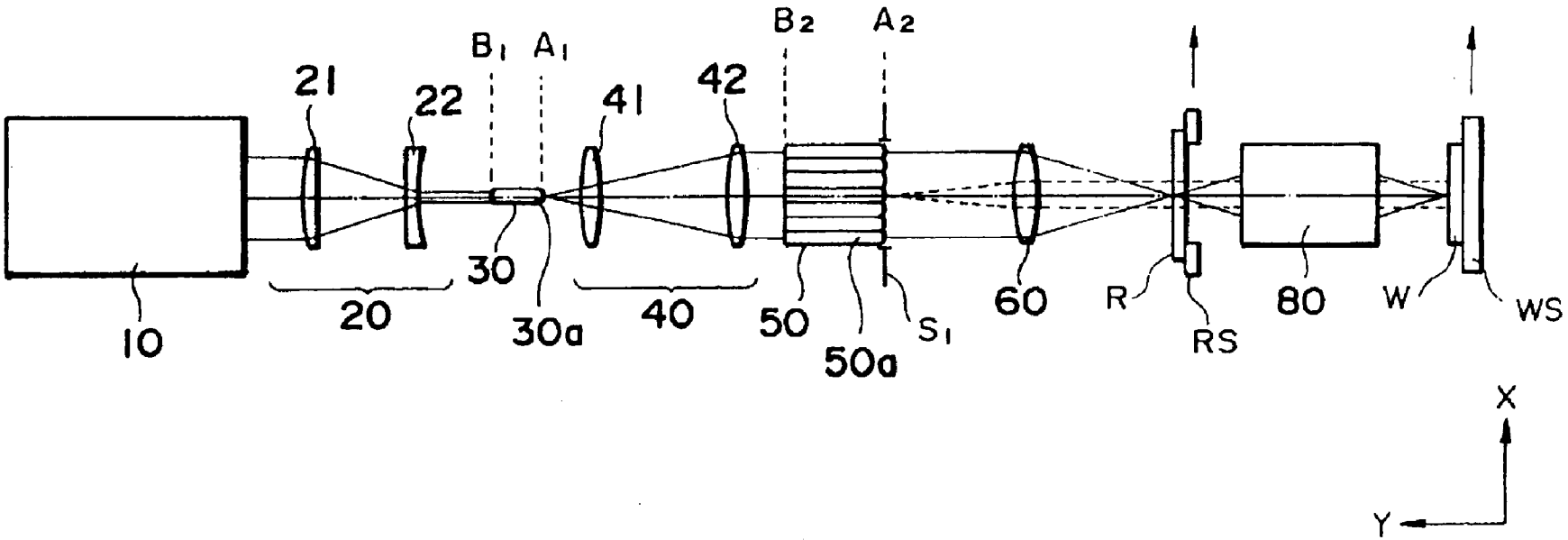
FIG. 5 is a side view to show the second embodiment of illumination optical apparatus.

The second embodiment according to the present invention will be next described referring to FIG. 5. The second embodiment is an example of application in which the illumination optical apparatus, which illuminates the reticle R as the object to be illuminated in a rectangular (slit) shape, is employed in an exposure apparatus for fabrication of semiconductors. The second embodiment is different from the first embodiment shown in FIGS. 1 to 4 in that the reticle R is illuminated in the rectangular shape using a condenser optical system 60 of refraction type and in that a projection optical system 80 of refraction type is used to transfer the circuit pattern on reticle R onto the wafer W, as shown in FIG. 5.

As shown in FIG. 5, an excimer laser 10 emits a beam of parallel rays, and the parallel beam passes through a beam shaping optical system 20 to be converted into a beam with a predetermined beam cross section. Then the beam is condensed by an optical integrator 30, in which a plurality of lens elements 30a each having a square lens cross section are aligned in line along the direction normal to the plane of FIG. 5. A line of plural light source images are formed along the direction normal to the plane of FIG. 5 at the exit plane position $A_1$ of the optical integrator 30. Then beams from the plural light source images pass through a relay optical system 40 and are condensed by an optical integrator 50, in which a plurality of lens elements 50a each having a rectangular lens cross section are arranged in a square. A plurality of light source images arranged in square are formed at the exit plane position $A_2$ of the optical integrator 50. An aperture stop $S_1$ having a circular aperture is provided at the light source image position $A_2$. The aperture stop $S_1$ shapes the plural light source images in a circular shape. Beams from the light source images shaped in circle enter the condenser optical system 60 of refraction type for illuminating a surface to be illuminated (reticle R) in a rectangular shape. The condenser optical system 60 has a front focus position coincident with the exit plane position $A_2$ of the optical integrator 50 and a rear focus position coincident with the surface to be illuminated on the reticle R. By this arrangement, beams from the plural light source images formed by the optical integrator 50 are condensed by the condenser optical system 60 to uniformly illuminate the reticle R in a superimposed manner in the rectangular shape.

The projection optical system 80 demagnifies and transfers the circuit pattern on the reticle R thus illuminated in the rectangular shape onto the wafer W. As a reticle stage RS holding the reticle R and a wafer stage WS holding the wafer W are moved in the direction of arrows, the circuit pattern formed on the entire surface of reticle R is copied on the wafer W.

The optical integrator 50 forms a plurality of light source images at the position of pupil (entrance pupil) of the projection optical system 80, though not shown, so that the pattern on the reticle R is duplicated on the wafer W under Kohler illumination.

Although the second embodiment also employs the parallel beam supplying portion of excimer laser supplying the beam of parallel rays, similarly as the first embodiment shown in FIGS. 1 and 2, the parallel beam supplying portion may be constructed for example by an ellipsoidal mirror 12, a mercury-arc lamp 11 as a point-source light emitting light of g-line (436 nm) or i-line (365 nm) disposed at the first focus position of the ellipsoidal mirror 12, and a collimator lens system 13 for changing into a beam of parallel rays the beam from a light source image formed at the second focus position of the ellipsoidal mirror while condensing the light from the mercury-arc lamp 11 by the ellipsoidal mirror 12.

Now described is an optimum construction of the two optical integrators 30, 50 in the embodiments shown in FIGS. 1 to 6.

Figure 6:
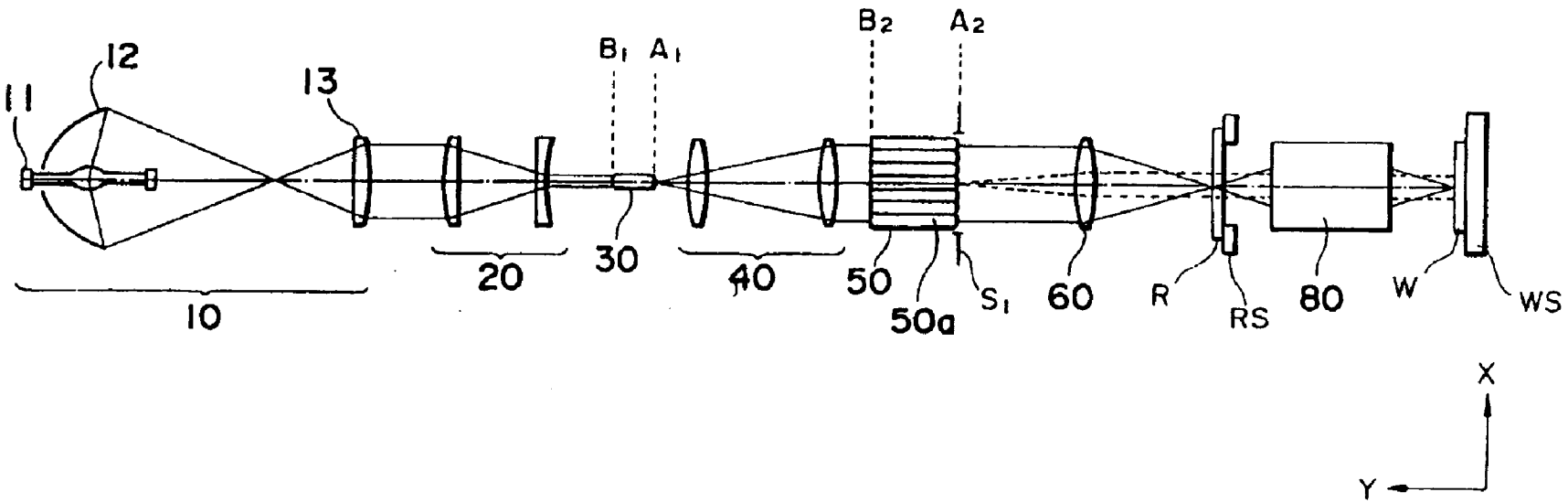
FIG. 6 is a side view to show a modification of the second embodiment of illumination optical apparatus.
Figure 7:
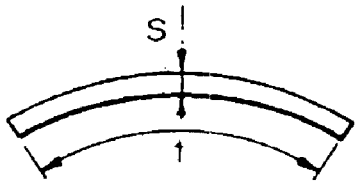
FIG. 7 is a drawing to show an arcuate illumination area.
Figure 8:
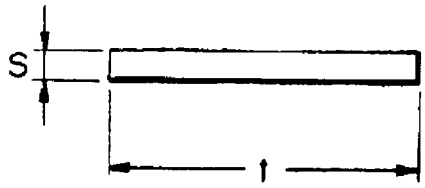
FIG. 8 is a drawing to show a rectangular illumination area.

An arcuate illumination area is formed on the reticle R, as shown in FIG. 7, in the first embodiment shown in FIGS. 1 to 4, while a rectangular (slit) illumination area is formed on the reticle R, as shown in FIG. 8, in the second embodiment shown in FIG. 5 and in the modification of the second embodiment shown in FIG. 6. It is preferable that the two optical integrators 30, 50 form light source images having a size corresponding to the size of the arcuate or rectangular illumination area formed on the reticle R.

Figure 9:
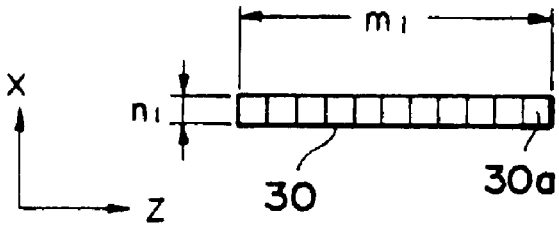
FIG. 9 is a drawing to show an optical integrator as light-source-image forming means.

Now, let s be the width of the central portion of arcuate illumination area or the transverse length of rectangular illumination area, t be the length of arc (chord) or the longitudinal length of rectangular illumination area, $m_1$ be the longitudinal length of the entire optical integrator 30, and $n_1$ be the transverse length of the entire optical integrator 30, as shown in FIGS. 7 to 9. The optical integrator 30 is preferably constructed to satisfy the following relation.

$$s/t=n_1/m_1 \tag{4}$$

If the lens elements 30a constituting the optical integrator 30 each have a ratio of height to width of cross section thereof being 1:1 for example, $m_1/n_1$ lens elements 30a are arranged in line.

Figure 10:
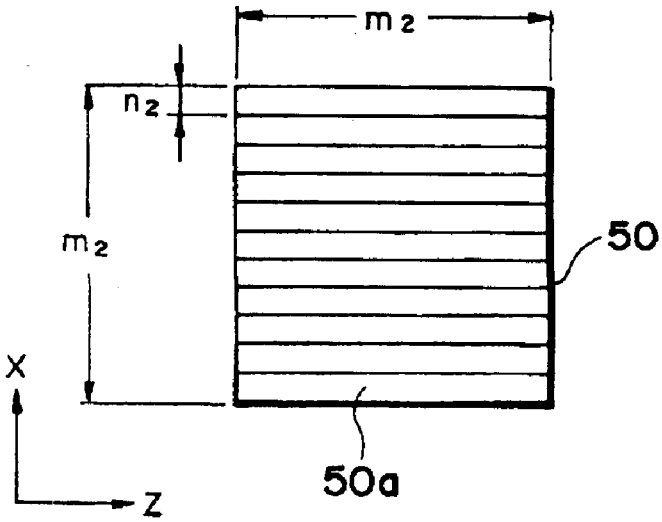
FIG. 10 is a drawing to show an optical integrator.

Also, a plurality of light source images from the optical integrator 30 are formed on the exit side of each lens element 50a in the optical integrator 50. Thus, letting $m_2$ be the longitudinal length of each lens element 50a in the optical integrator 50 and $n_2$ be the transverse length of lens element 50a, as shown in FIG. 10, it is preferable that the lens element 50a satisfies the following relation of Equation (5).

$$n_1/m_1=n_2/m_2(=s/t) \tag{5}$$

If the entire optical integrator 50 is formed in a perfect square for example, $m_2/n_2$ lens elements 50a are arranged in line.

For example, suppose that the ratio of the central width s to the arc (chord) length t of the arcuate illumination area or the ratio of the transverse length s to the longitudinal length t of the rectangular illumination area is 1/11, that the ratio of height to width of lens element 30a is 1:1, and that the total optical integrator 50 is formed in a perfect square. Then the optical integrator 30 includes eleven lens elements 30a arranged in line as shown in FIG. 9, while the optical integrator 50 includes eleven lens elements 50a arranged in line as shown in FIG. 10. Consequently, there are eleven light source images formed linearly (in line) on the exit side of optical integrator 30, and 121 (11×11) light source images formed in square on the exit side of optical integrator 50. In other words, the 121 (11×11) light source images are arranged in a shape of a square matrix which has 11 horizontal rows running parallel at regular intervals and 11 vertical rows running parallel at regular intervals. This permits uniform illumination in the arcuate or rectangular shape on the reticle R at high illumination efficiency.

The above embodiments shown in FIGS. 1 to 6 showed examples in which the two optical integrators 30, 50 each were constituted by a line of lens elements. Next described are an example in which the optical integrator 30 includes two lines of lens elements 30a, and an example in which the optical integrator 50 includes two lines of lens elements.

Figure 11:
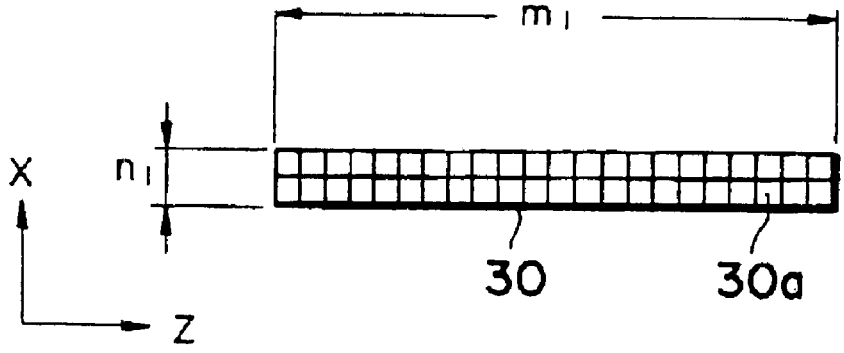
FIG. 11 is a drawing to show another example of optical integrator as light-source-image forming means.

The embodiments shown in FIGS. 1 to 6 employ the optical integrator 30 in which a plurality of lens elements 30a are aligned in line as shown in FIG. 9, while the following example illustrates an optical integrator 30 as shown in FIG. 11 in place thereof.

FIG. 11 shows an optical integrator 30 which includes two lines of lens elements 30a each having a same curvature (refracting power) in the X direction and in the Z direction perpendicular thereto. The lens element 30a has a square lens cross section and the optical integrator 30 has a lens cross section satisfying the above relation of Equation (4) as a whole.

If the optical integrator 30 shown in FIG. 11 is constituted by $N_1$ lines of lens elements 30a, the optical integrator 30 with $N_1$ lines of lens elements 30a includes $N_1^2m_1/n_1$ lens elements 30a. There are $N_1^2m_1/n_1$ light source images formed in a rectangular shape on the exit side of the optical integrator 30.

Then, if the above relation of Equation (5) is satisfied by lens elements 50a constituting the optical integrator 50 as shown in FIG. 10 and if the optical integrator 50 is constructed in a perfect square of cross section as a whole with a line of $m_2/n_2$ lens elements 50a, there are $N_1^2m_1m_2/(n_1n_2)$ light source images formed in a square arrangement on the exit side of the optical integrator 50. Therefore, this arrangement can form a lot of light source images $N_1^2$ times those in the first embodiment, whereby more uniform illumination can be attained on the reticle R of object to be illuminated.

As an example, suppose that the ratio of the width s of central portion to the length t of arc (chord) of the arcuate illumination area or the ratio of the transverse length s to the longitudinal length t of the rectangular illumination area is 1/11, that a ratio of height to width of lens element 30a is 1:1, and that the optical integrator 50 is arranged in a perfect square as a whole. Then the optical integrator 30 includes forty four lens elements 30a in two lines, as shown in FIG. 11, while the optical integrator 50 includes a line of eleven lens elements 50a, as shown in FIG. 10. Accordingly, there are forty four light source images formed in two lines on the exit side of the optical integrator 30 and 484 (44×11) light source images formed in the square arrangement on the exit side of the optical integrator 50.

Figure 12:
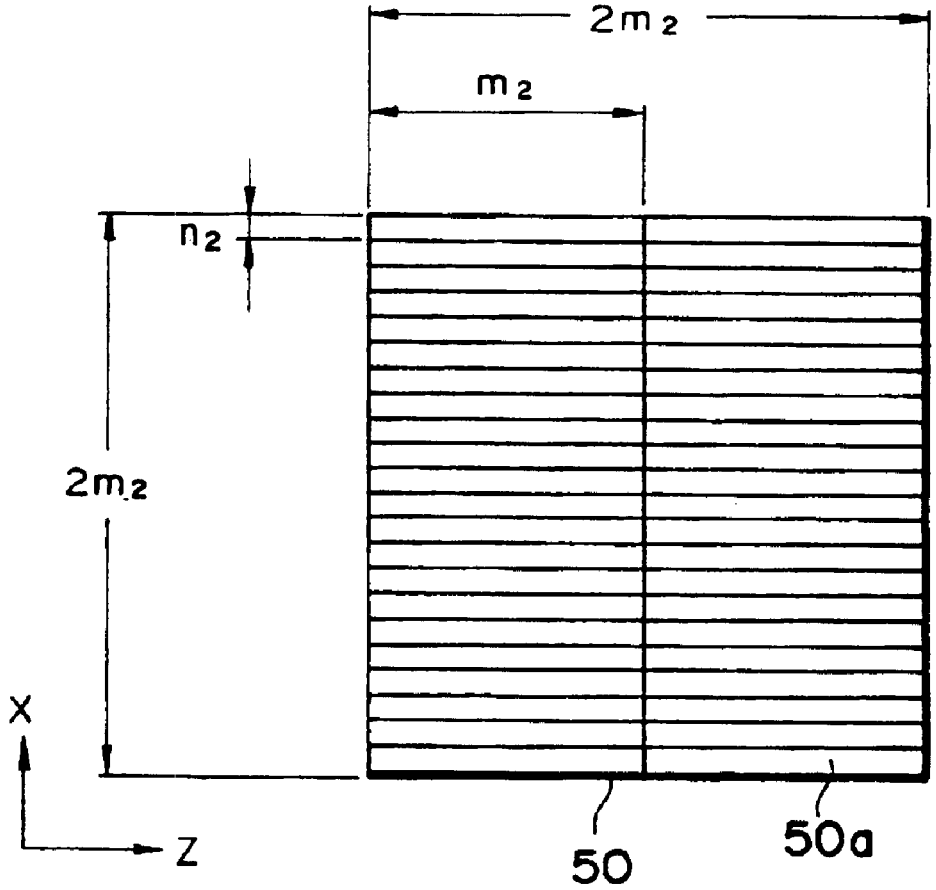
FIG. 12 is a drawing to show another example of optical integrator.

The embodiments in FIGS. 1 to 6 show the optical integrator 50 in which a line of plural lens elements 50a are aligned, as shown in FIG. 10, while the following example illustrates an optical integrator 50 as shown in FIG. 12 instead thereof.

FIG. 12 shows an optical integrator 50 composed of two lines of lens elements 50a each having a same curvature (refracting power) in the X direction and in the Z direction perpendicular thereto. It is assumed herein that each lens element 50a is formed to satisfy the above relation of Equation (5) and the assembly of lens elements 50a constitute the square optical integrator 50.

If the optical integrator 50 as shown in FIG. 12 is constituted by $N_2$ lines of lens elements 50a, the optical integrator 50 with $N_2$ lines of lens elements 50a includes $N_2^2m_2/n_2$ lens elements 50a. Then, there are $m_1/n_1$ light source images linearly formed on the exit side of the optical integrator 30 having a line of $m_1/n_1$ lens elements, and $N_2^2m_1m_2/(n_1n_2)$ light source images formed in a square arrangement on the exit side of the optical integrator 50 composed of $N_2$ lines of $N_2^2m_2/n_2$ lens elements 50a. Accordingly, this arrangement can form a lot of light source images $N_2^2$ times those in the first embodiment, whereby more uniform illumination can be obtained on the reticle R as the object to be illuminated.

As an example, suppose that the ratio of the width s of the central portion to the length t of arc (chord) of the arcuate illumination area or the ratio of the transverse length s to the longitudinal length t of the rectangular illumination area is 1/11, that the ratio of height to width of lens element 30a is 1:1, and the optical integrator 50 is constructed in a perfect square shape as a whole. Then the optical integrator 30 includes a line of eleven lens elements 30a, as shown in FIG. 9, while the optical integrator 50 includes two lines of forty four lens elements 50a, as shown in FIG. 12. Therefore, there are eleven light source images formed in line on the exit side of the optical integrator 30 and 484 (11×44) light source images formed in the square arrangement on the exit side of the optical integrator 50.

As described above, either one of optical integrators 30, 50 can be constructed as an optical integrator in which a plurality of lens elements are arranged in line, and the other as an optical integrator in which a plurality of lens elements are arranged in two lines. Further, the two optical integrators 30, 50 each with two lines of lens elements may be combined in another arrangement.

In this arrangement, the optical integrator 30 in which $N_1$ lines of lens elements 30a are arranged includes $N_1^2m_1/n_1$ lens elements 30a, while the optical integrator 50 in which $N_2$ lines of lens elements 50a are arranged includes $N_2^2m_2/n_2$ lens elements 50a. Accordingly, there are $N_1^2m_1/n_1$ light source images formed in a square arrangement on the exit side of the optical integrator 30 and $N_1^2N_2^2m_1m_2/(n_1\ n_2)$ light source images formed in a square arrangement on the exit side of the optical integrator 50.

Consequently, the combination of two optical integrators 30, 50 each with two lines of lens elements can enjoy synergistic effect of illumination uniformity between the two optical integrators, which is very advantageous.

In the embodiments as described above, the optical integrator 50 forms a plurality of light source images in the square arrangement and the thus obtained square beam is shaped into a circular beam by the aperture stop $S_1$ disposed at the position of the light source images. It is needless to say that the square cross section of optical integrator 50 can be somewhat modified into a nearly circular section corresponding to the shape of circular aperture in the aperture stop $S_1$.

Embodiment 3

Figure 13:
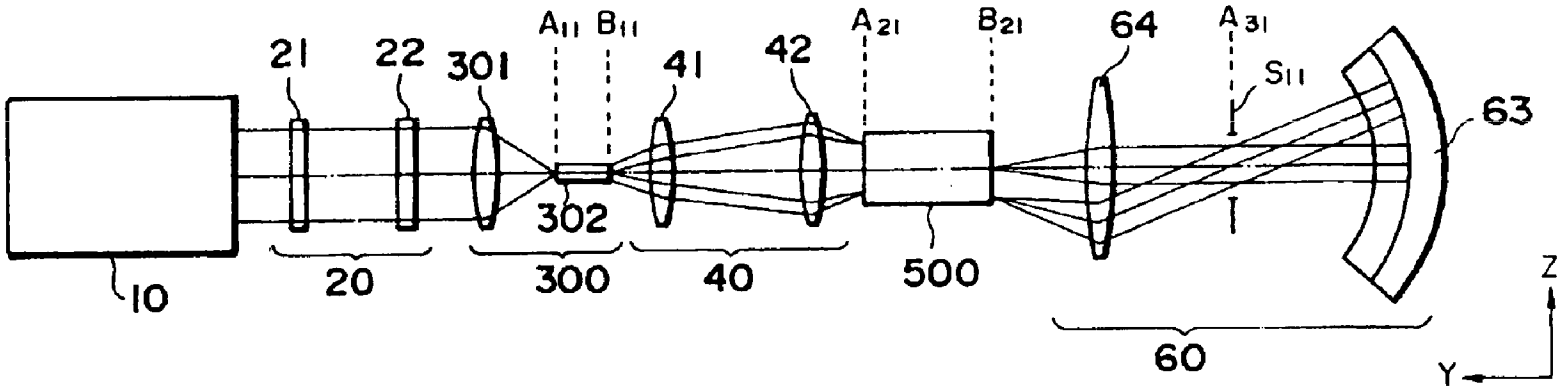
FIG. 13 is a plan view to show the third embodiment of illumination optical apparatus.
Figure 14:
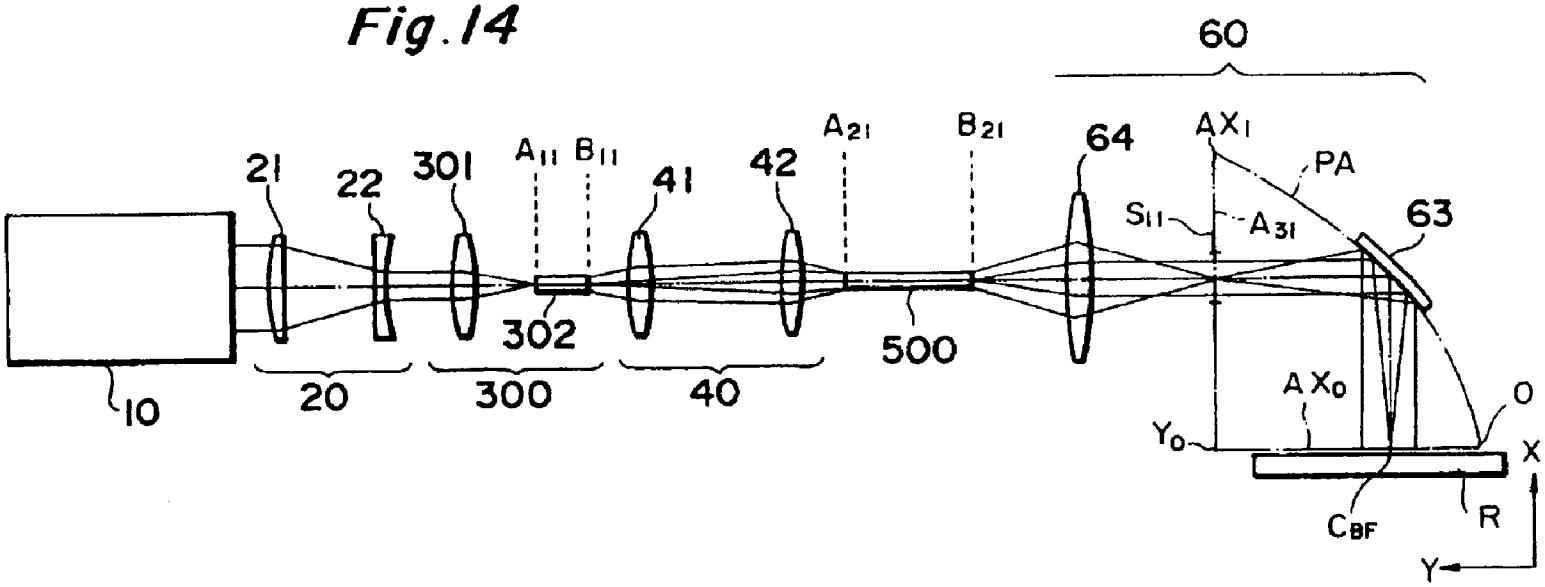
FIG. 14 is a side view to show the third embodiment of illumination optical apparatus.
Figure 15:
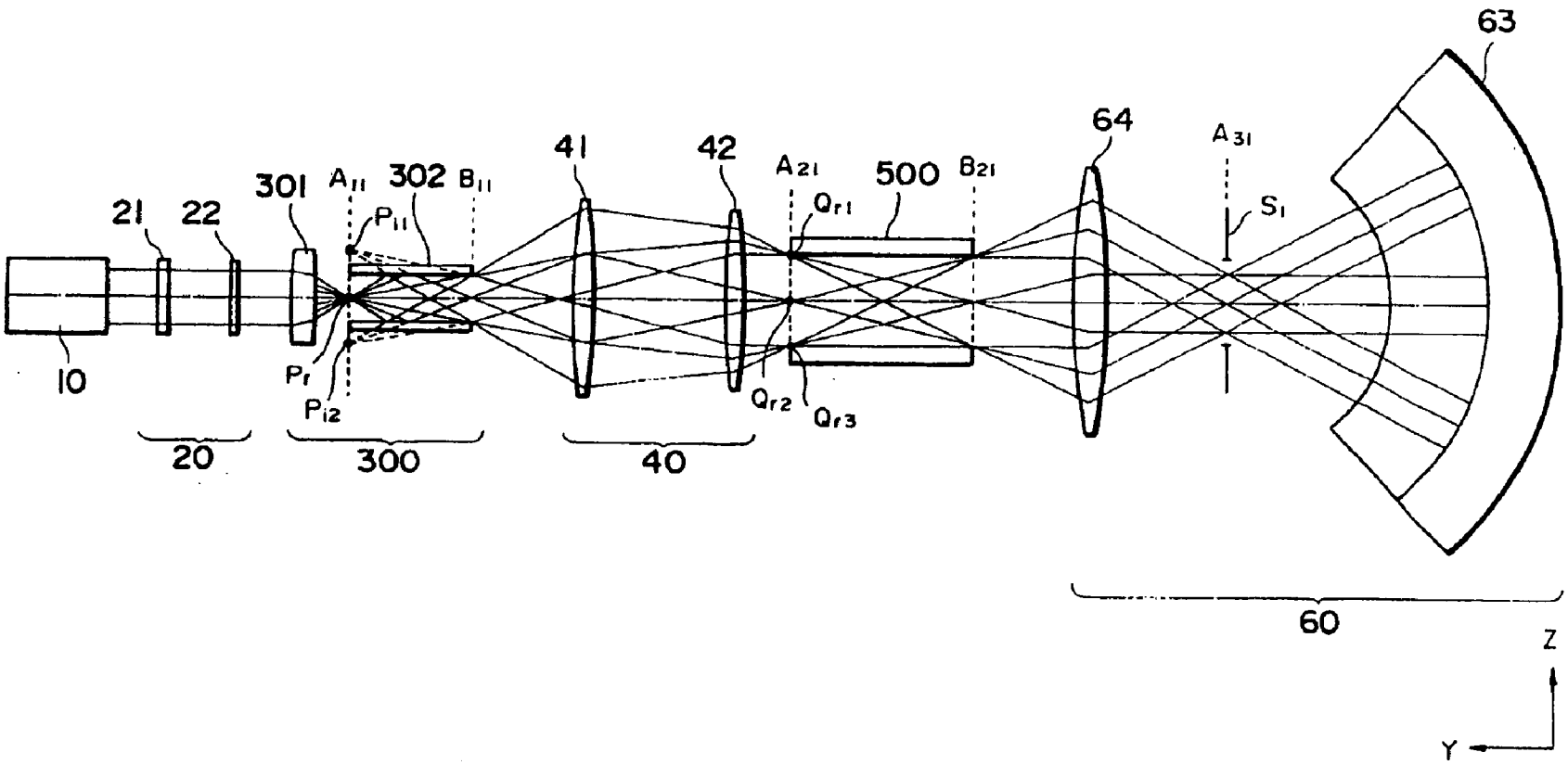
FIG. 15 is a plan view to show a detailed ray diagram in the third embodiment of illumination optical apparatus.
Figure 16:
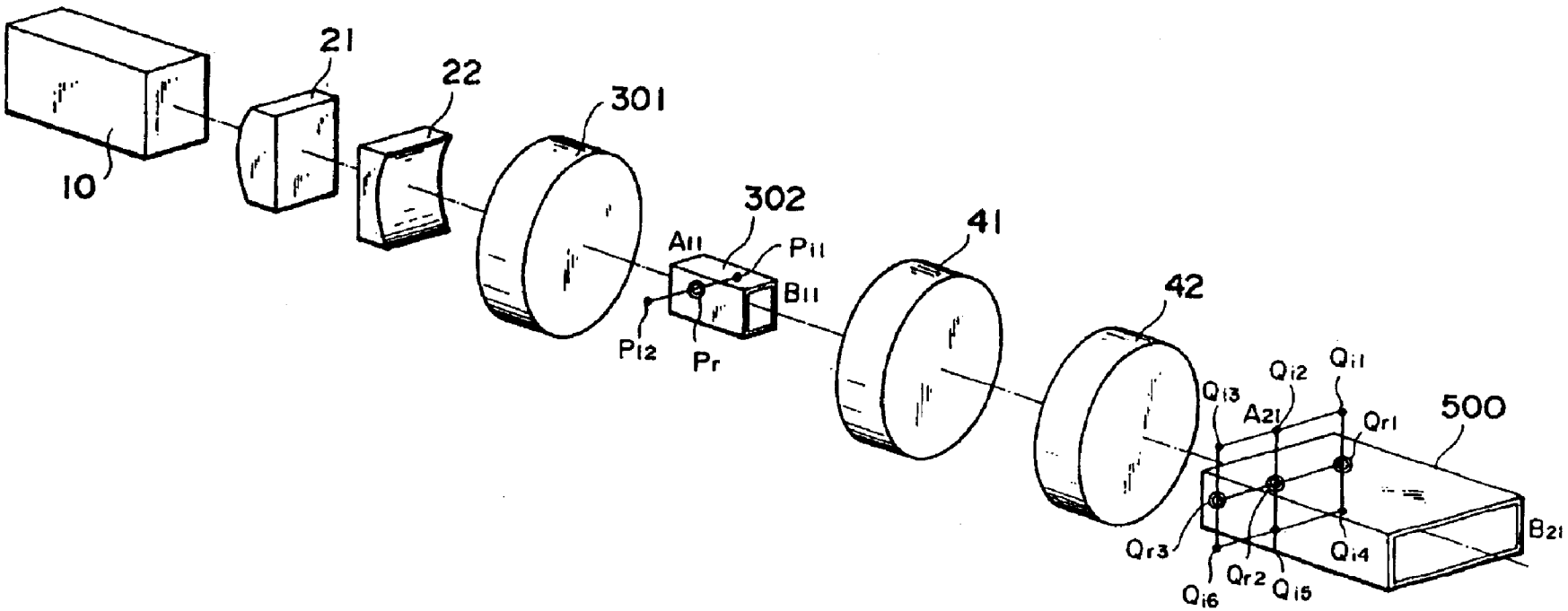
FIG. 16 is a perspective view to show some of constituent elements in the third embodiment of illumination optical apparatus.

The third embodiment of the present invention will be next described referring to FIGS. 13 to 17. FIG. 13 is a plan view to show the structure of the apparatus in the third embodiment as seen from immediately above the apparatus, and FIG. 14 is a side view to show the structure in cross section as seen from the side of apparatus. Also, FIG. 15 is a drawing to show a detailed diagram of rays in FIG. 13, and FIG. 16 is a perspective view to show some of constituent elements in the apparatus of the third embodiment.

Figure 19:
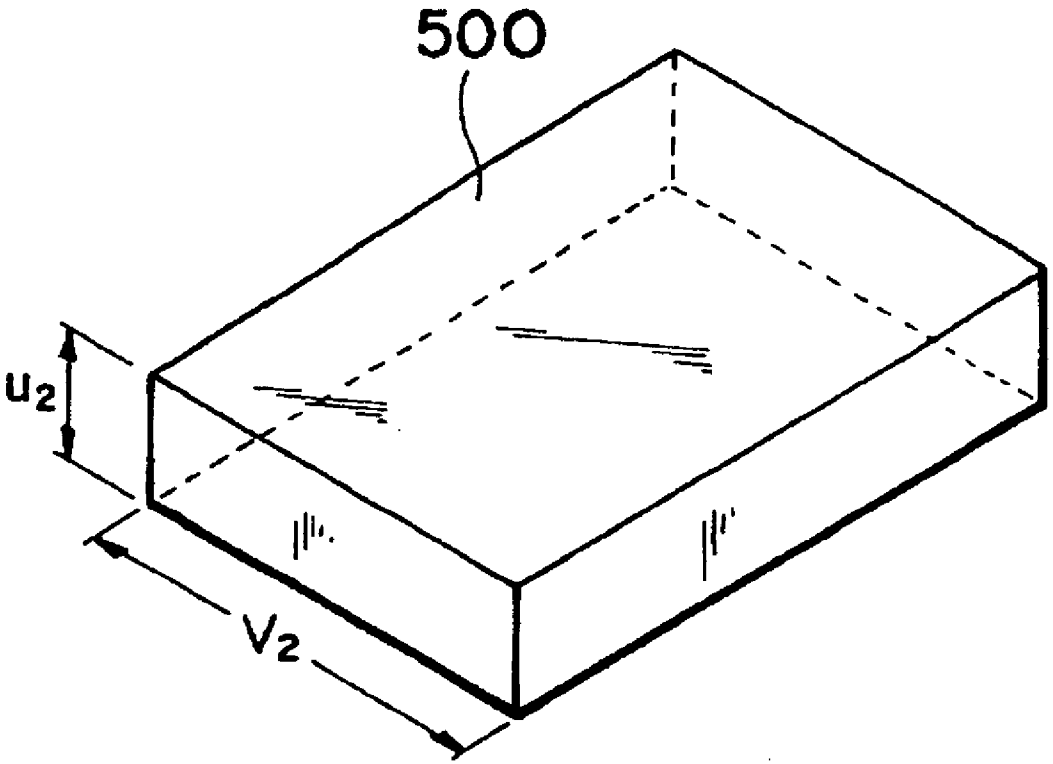
FIG. 19 is a perspective view to show an optical member of internal reflection type.
Figure 18:
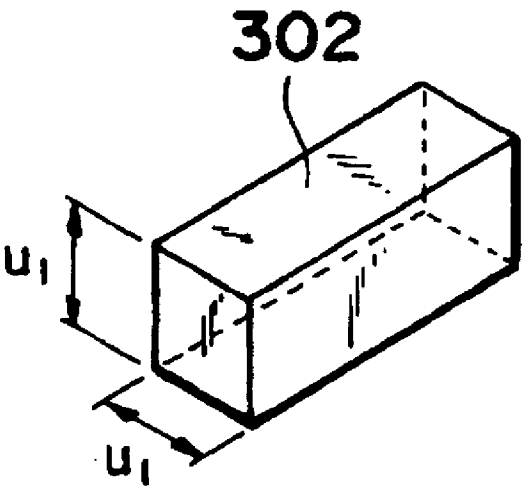
FIG. 18 is a perspective view to show an optical member of internal reflection type as light-source-image forming means.

The third embodiment is an example in which optical members 302, 500 of internal reflection type such as glass rods as shown in FIGS. 18 and 19 (internal reflection type integrators of quadrangular prism) replace the two optical integrators 30, 50 in the first embodiment shown in FIGS. 1 to 4, whereby the uniform arcuate illumination is realized on the reticle R. Here, the optical members 302, 500 used in FIGS. 15 and 16 are internal reflection type optical members of hollow quadrangular prism.

As shown in FIGS. 13 and 14, an excimer laser 10 emits a beam of parallel rays, and the beam passes through a beam shaping optical system 20 to be converted into a beam of predetermined cross section. The shaped beam then enters light-source-image forming means 300 for forming a plurality of images of light source arranged in line. The light-source-image forming means 300 is composed of a condenser lens 301 for condensing the beam of parallel rays from the beam shaping optical system 20 and an optical member 302 of internal reflection type having a cross section of substantial square.

The condenser lens 301 is located such that the rear focus position thereof coincides with an entrance plane position $A_{11}$ of the optical member 302, so that the condenser lens 301 forms a light source image $P_T$ at the center of entrance plane position $A_{11}$. Rays from the light source image repeat internal reflection on two planes normal to the plane of FIG. 15 in the internal reflection type optical member 302 and leave the optical member 302 at the exit end thereof. If the reflected rays are extended on the condenser lens (301) side, they are converged at $P_{i1}$ and $P_{i2}$ at the entrance plane position $A_{11}$, as shown in FIG. 15. Thus, there are a real image $P_r$ and two virtual images $P_{i1}$, $P_{i2}$ formed at the entrance plane position $A_{11}$, as clearly shown in FIG. 16, so that the beams are outgoing from the exit end of the member 302 as if there were a plurality of (three in this case) light source images arranged in line (in the horizontal direction in this case) at the entrance plane position $A_{11}$.

As shown in FIG. 15, the beams outgoing from the internal reflection type optical member 302 pass through a relay optical system 40 and then enter the optical member 500 of internal reflection type having a rectangular cross section. Thus, there are a plurality of (three in this case) light source images (real images) $Q_{r1}$, $Q_{r2}$, $Q_{r5}$ formed in line (in the horizontal direction in this case) by the member 302 at the entrance plane position $A_{21}$ of the member 500 (see FIG. 16).

Then beams from the plural light source images (real images) repeat internal reflection on two planes parallel to the plane of FIG. 15 in the internal reflection type optical member 500 then to leave the member 500 at the exit end thereof. If the reflected rays are extended on the optical system 40 side, they are converged at six points $Q_{i1}$ to $Q_{i6}$ on the entrance plane at position $A_{21}$ as shown in FIG. 16. Accordingly, there are three real images $Q_{r1}$ to $Q_{r3}$ and six virtual images $Q_{i1}$ to $Q_{i6}$ formed on the entrance plane at position $A_{21}$, as clearly shown in FIG. 16, so that rays are outgoing from the exit end of the member 500 as if there were a plurality of (nine in this case) light source images arranged on a plane at the entrance plane position $A_{21}$.

As apparent from the above description, a requirement for the internal reflection type optical member 302 is that it has two vertical reflection planes extending in the horizontal direction, and therefore the horizontal reflection planes are not always necessary. Similarly, a requirement for the internal reflection type optical member 500 is that it has two horizontal reflection planes extending in the vertical direction, and therefore the vertical reflection planes are not always necessary.

The relay optical system 40 makes the entrance plane position $A_{11}$ of the internal reflection type optical member 302 conjugate with the entrance plane position $A_{21}$ of the internal reflection type optical member 500, and the exit plane position $B_{11}$ of the internal reflection type optical member 302 conjugate with the exit plane position $B_{21}$ of the internal reflection type optical member 500.

The beams outgoing from the internal reflection type optical member 500 are condensed by a condenser optical system 60 to illuminate a surface to be illuminated (reticle R) in a superimposed manner in an arcuate shape.

The condenser optical system 60 is composed of a first condenser lens 64 of refraction system and a second condenser lens 63 of reflection system. There is an aperture stop $S_{11}$ having a circular or elliptical aperture provided at the rear focus position $A_{31}$ of the first condenser lens 64. Thus, beams outgoing from the internal reflection type optical member 500 are condensed by the first condenser lens 64 to form real images of the plural light source images formed by the internal reflection type optical member 500, at the position $A_{31}$ of the aperture stop $S_{11}$. Then the beams from the plural light source images are shaped in circle by the aperture stop $S_{11}$. The thus shaped beams are condensed by the second condenser lens 83 to directly form an arcuate illumination area on the surface to be illuminated (reticle R).

Figure 17:
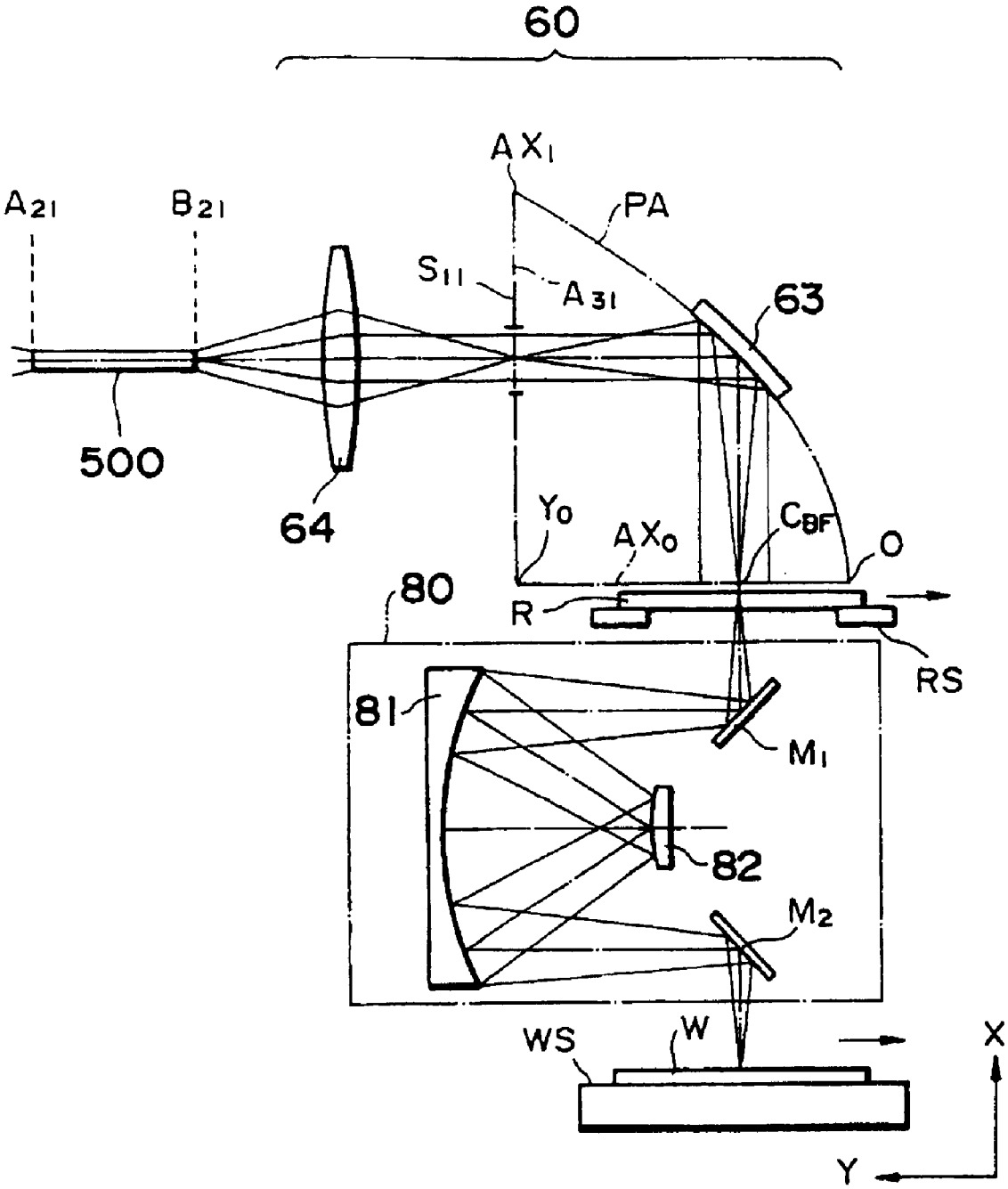
FIG. 17 is a side view of a projection exposure section for replication of circuit pattern on reticle R onto a wafer W, using the third embodiment of illumination optical apparatus.

A circuit pattern on the reticle R thus illuminated in the arcuate shape is transferred through a projection optical system 80 onto a wafer W, as shown in FIG. 17. As a reticle stage RS holding the reticle R and a wafer stage WS holding the wafer W are moved in the direction of arrows, the circuit pattern formed on the entire reticle R is duplicated on the wafer W.

Since the plural light source images formed by the internal reflection type optical member 500 are formed on a pupil (entrance pupil) of the projection optical system 80, though not shown, the pattern on the reticle R can be duplicated on the wafer W under the Köhler illumination.

If the second condenser lens 63 of reflection type in the present embodiment is replaced by a refraction type lens with a front focus position thereof coinciding with the position $A_{31}$ of plural light source images formed by the first condenser lens 64 and with a rear focus position thereof coinciding with the reticle R, the reticle R can be illuminated in a rectangular (slit) shape.

Although the third embodiment employs the excimer laser as the parallel beam supplying portion for supplying a beam of parallel rays, the invention is not limited to it. For example, the parallel beam supplying portion may be constructed by using a mercury-arc lamp emitting light of g-line (436 nm) or i-line (365 nm), an ellipsoidal mirror for collecting light from the mercury-arc lamp, and a collimator lens system for converting the beam collected by the ellipsoidal mirror into a beam of parallel rays.

Further, the internal reflection type optical member 500 is not limited to the glass rod, but may be an internal reflection type optical member of hollow quadrangular prism as shown in FIG. 15 or 16.

As described above, the third embodiment can be constructed using the two internal reflection type optical members 302, 500 which are very simple in structure. In addition, rays from light source images, which are a plurality of light source images (virtual images) formed on the entrance plane of each internal reflection type optical member 302, 500, have different path length depending upon the number of internal reflection in the each internal reflection type optical member 302, 500, which advantageously lowers the coherency of beam. This is advantageous especially with a light source of laser.

Next described referring to FIGS. 7, 8, 18 and 19 is the most suitable arrangement of the two internal reflection type optical members 302, 500 in the third embodiment. FIG. 18 is a perspective view of the internal reflection type optical member 302 and FIG. 19 is a perspective view of the internal reflection type optical member 500.

The third embodiment shown in FIGS. 13 to 17 can form an arcuate illumination area on the reticle R, as shown in FIG. 7. Further, slightly modifying the structure of condenser optical system 60 in the third embodiment as described above, a rectangular (slit) illumination area can be formed on the reticle R, as shown in FIG. 8. It is preferable that the two internal reflection type optical members 302, 500 form light source images in a size corresponding to the size of arcuate or rectangular illumination area formed on the reticle R.

Now, let s be the width of central portion of the arcuate illumination area or the transverse length of the rectangular illumination area, t be the length of arc (chord) or the longitudinal length of the rectangular illumination area, $u_2$ be the transverse length of cross section of the internal reflection type optical member 500, and $v_2$ be the longitudinal length of cross section of the internal reflection type optical member 500, as shown in FIGS. 7, 8, 18 and 19. Then the following relation is preferably satisfied.

$$s/t=u_2/v_2 \tag{6}$$

Further, letting $u_1$ be the length of a side of cross section of the internal reflection type optical member 302, and β be an imaging magnification of the relay optical system, the following relation is preferably satisfied.

$$u_1=\beta u_2 \tag{7}$$

If the two internal reflection type optical members 302, 500 are constructed to form light source images with a size corresponding to the size of illumination area in the above relations, the reticle R can be uniformly illuminated in an arcuate or rectangular shape at remarkably high illumination efficiency.

It is needless to say that in the present invention the light-source-image forming means may be constructed as either one of an optical integrator and an internal reflection type optical member and that the other may be used for forming a plurality of light source images in a substantially square arrangement.

Also, as described in the above embodiments, it is preferable that the beam shaping optical system 20, which shapes a beam from the parallel beam supplying portion 10 into a beam of rectangular cross section, shapes the beam in a size corresponding to the size of arcuate or rectangular illumination area, whereby the quantity of light can be efficiently utilized. Suppose that s is the width of central portion of arcuate illumination area or the transverse length of rectangular illumination area, that t is the length of arc (chord) or the longitudinal length of rectangular illumination area, that $B_s$ is the transverse length of cross section of beam outgoing from the beam shaping optical system 20, and that $B_t$ is the longitudinal length of cross section of beam outgoing from the beam shaping optical system 20. Then the relation of $s/t=B_s/B_t$ is more preferably satisfied.

Further, although the above embodiments each are so arranged that the light supply means is composed of the parallel beam supplying portion 10 for supplying a beam of parallel rays and the beam shaping optical system 20 for shaping the beam of parallel rays into a beam of rectangular cross section, it should be noted that the beam shaping optical system 20 constituting a part of the light supply means is not essential in the principle of the present invention. Namely, if the light supplying means is a light source for supplying a beam of parallel rays in a rectangular cross section, uniform illumination (Köhler illumination) can be realized on the surface to be illuminated (reticle R) at high illumination efficiency while forming an arcuate or rectangular illumination area on the surface to be illuminated (reticle R), without providing the beam shaping optical system 20.

For example, a light source such as an excimer laser normally supplies a beam of parallel rays having a rectangular cross section. If the relation of $s/t=L_s/L_t$ is satisfied, where s is the width of central portion of arcuate illumination area or the transverse length of rectangular illumination area, t the length of arc (chord) or the longitudinal length of rectangular illumination area, $L_s$ the transverse length of cross section of excimer laser beam, and $L_t$ the longitudinal length of cross section of excimer laser beam, the surface to be illuminated (reticle R) can be uniformly illuminated in the arcuate or rectangular shape, at remarkably high illumination efficiency even with the light supplying means composed only of a light source such as excimer laser. Also, the light supplying means can be simply a light source supplying a beam of parallel rays. Also with such a light source, the surface to be illuminated (reticle R) can be uniformly illuminated (under Köhler illumination) in the arcuate or rectangular shape at relatively high illumination efficiency.

Figure 20:
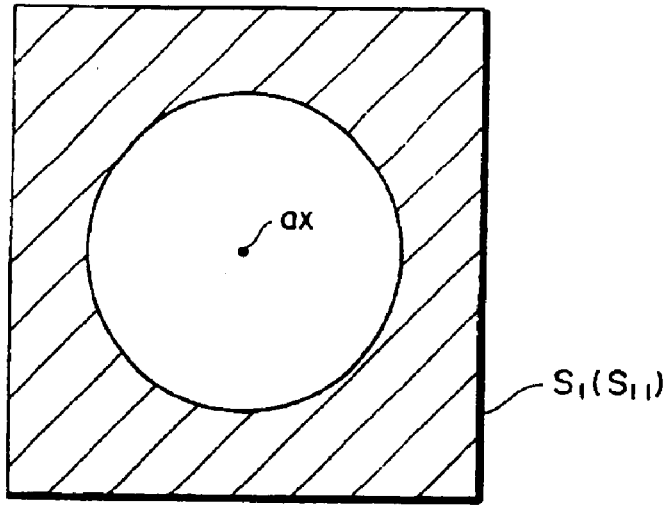
FIG. 20 is a drawing to show an aperture stop having a circular aperture.
Figure 21:
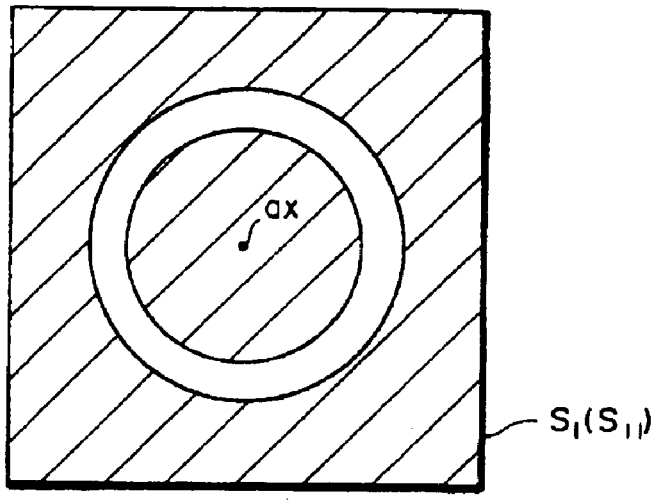
FIG. 21 is a drawing to show an aperture stop having an annular aperture.
Figure 22:
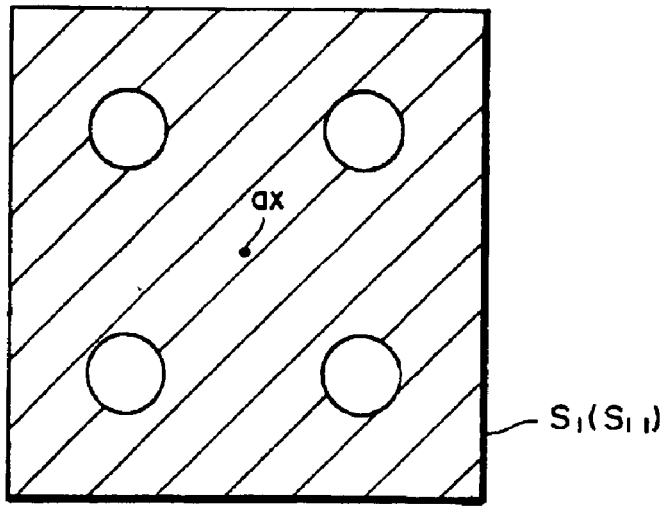
FIG. 22 is a drawing to show an aperture stop having a plurality of apertures offset from the optical axis of illumination optical system.

Although the embodiments shown in FIGS. 1, 2, 5, 6, 13 and 14 show examples employing the aperture stop $S_1$ or $S_{11}$ having a circular aperture as shown in FIG. 20, the aperture stop $S_1$ or $S_{11}$ may be replaced by another aperture stop $S_1$ or $S_{11}$ as shown in FIG. 21 or FIG. 22. In FIGS. 20 to 22, ax represents a position of optical axis of illumination optical system when the field stop of FIG. 22 is set in the illumination optical system.

Employing the aperture stop $S_1$ or $S_{11}$ having an annular aperture as shown in FIG. 21, an arcuate or rectangular illumination area can be formed on the reticle R with the surface to be illuminated R (reticle) being illuminated with illumination light obliquely incident thereinto, whereby the resolving power and the focal depth of projection optical system 80 can be improved.

Also, the aperture stop $S_1$ or $S_{11}$ having a circular aperture as shown in FIG. 20 may be replaced by an aperture stop $S_1$ or $S_{11}$ having a plurality of apertures offset from the optical axis ax of illumination optical system (for example two or four apertures offset therefrom), whereby the resolving power and the focal depth of projection optical system 80 can be further improved. The detailed technology about it is disclosed for example in Japanese Laid-open Patent Application No. 4-225514.

Figure 23:
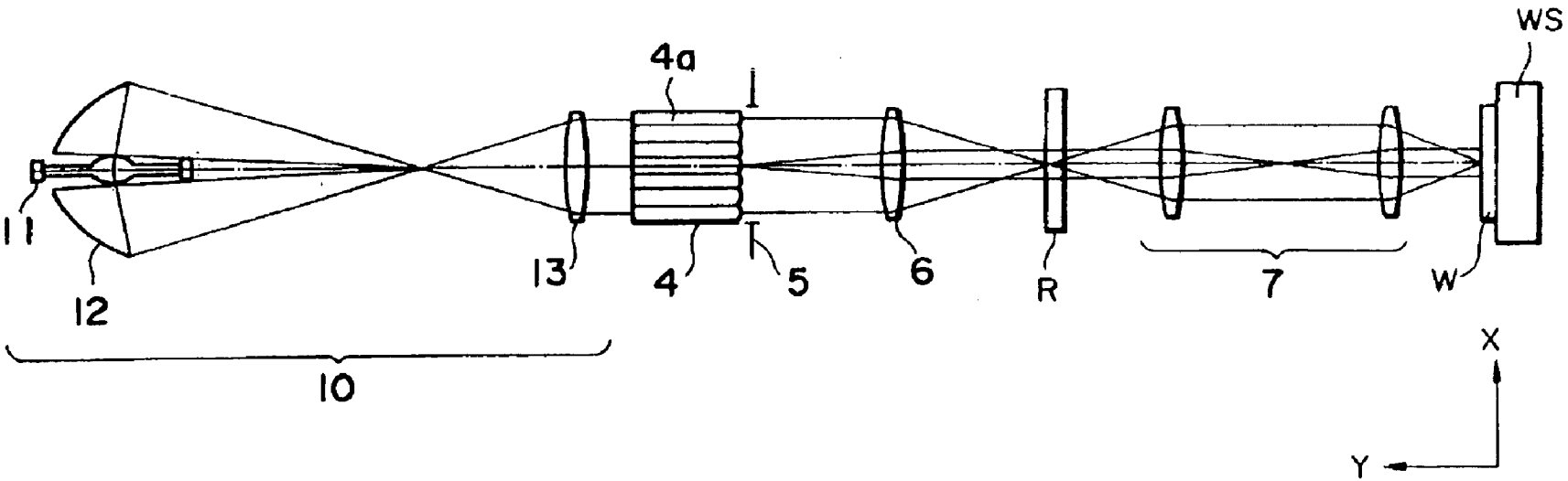
FIG. 23 is a drawing to show an exposure apparatus provided with an illumination optical apparatus having a single optical integrator.

Let us now consider that an illumination optical apparatus provided with a single optical integrator 4 as shown in FIG. 23 is applied to the aforementioned scanning exposure method to obtain a rectangular illumination area.

Figure 24:
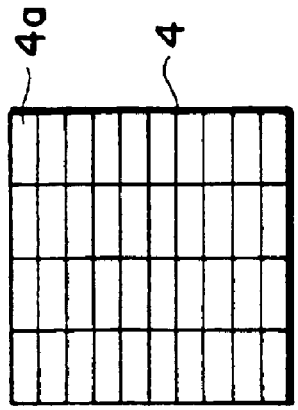
FIG. 24 is a drawing to show an optical integrator used in the apparatus shown in FIG. 23.

To realize it, the optical integrator 4 may be well constructed by rectangular lens elements 4a as shown in FIG. 24.

In more detail, the optical integrator 4 includes lens elements 4a each having a shape of rectangle similar to the shape of illumination area, as shown in FIG. 24, so that beams from the respective lens elements 4a constituting the optical integrator 4 illuminate the reticle R in the rectangular shape in a superimposed manner. In order to maintain constant the numerical aperture of illumination optical system to the illumination area on the reticle R, a plurality of lens elements 4a having the rectangular lens cross section are arranged in a square and the circular aperture in the aperture stop 5 is arranged to be inscribed to the contour of the optical integrator 4. This permits the rectangular illumination on the reticle R at high illumination efficiency.

However, since the optical integrator 4 having the cross section shown in FIG. 24 is constituted by the lens elements 4a each having a rectangular shape, the number of columns is greatly different from the number of rows of lens elements. For example, there are ten rows and four columns in case of FIG. 24.

Accordingly, beams from numerous lens elements 4a are superimposed in the illumination area in the direction in which a number of lens elements 4a are aligned, whereas beams from a small number of lens elements 4a are superimposed in the illumination area in the direction in which the small number of lens elements 4a are arranged. Therefore, averaging effect is great in the direction in which the numerous illumination beams are superimposed, so as to enhance the illumination uniformity. The averaging effect is dull in the direction in which the small number of illumination beams are superimposed, so that the illumination uniformity is so poor as to enhance illumination unevenness. Thus, the illumination uniformity differs depending upon the direction. For example, in case of the optical integrator of FIG. 24, there are ten illumination beams superimposed in the vertical direction, but only four illumination beams superimposed in the horizontal direction, which degrades the illumination uniformity thereby to enhance the illumination unevenness.

In contrast, the embodiments as shown in FIGS. 1, 2, 5 and 6 are so arranged that a plurality of light source images formed by the optical integrator 50 are arranged in a square or in a circular shape (with a circular aperture stop) in which a same number of light source images are arranged both in the vertical direction and in the horizontal direction. Therefore, the illumination is uniform in the illumination area irrespective of the direction. Similarly, the embodiment shown in FIGS. 13 and 14 is so arranged that light source images (real images and virtual images) are formed at the entrance plane position of the internal reflection type optical member 500 in a square in which a same number of images are arranged both in the vertical direction and in the horizontal direction. Therefore, the illumination is uniform in the illumination area irrespective of the direction.

Embodiment 4

In the illumination optical apparatus shown in FIG. 6, the first-stage optical integrator 30 has the rectangular outer shape. When a beam of a nearly circular cross section emitted from the mercury-arc lamp 11 and the ellipsoidal mirror 12 is supplied to the first-stage optical integrator 30 having such a rectangular outer shape, there is such a problem that a light quantity loss in the first-stage optical integrator 30 is large even if the cross section of beam is shaped into an elliptic shape by the lens systems 13 and 20.

Figure 25:
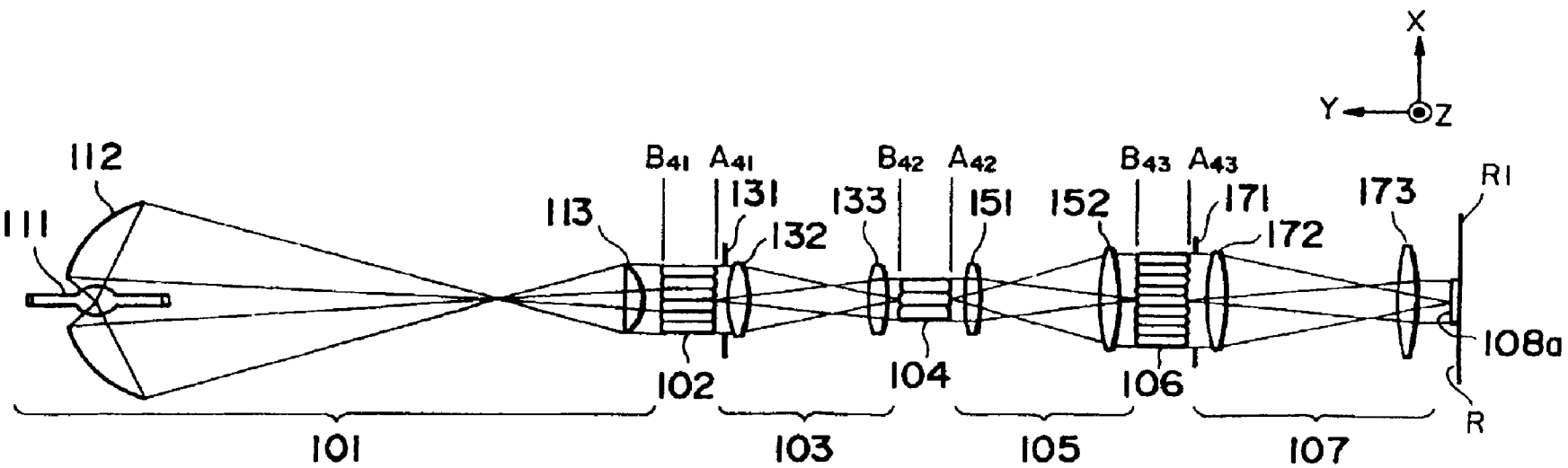
FIG. 25 is a drawing to show an illumination optical apparatus in the fourth embodiment.

In view of the above point, FIG. 25 shows an example of an illumination optical apparatus which can illuminate an illumination region with high uniformity of illuminance distribution and with high illumination efficiency when the rectangular, arcuate, or other illumination region on the illuminated surface is illuminated using a light source supplying a beam, for example, of a circular cross section.

The present embodiment is an example in which the illumination optical apparatus of the present invention is applied to an illumination system in an exposure apparatus for semiconductor fabrication.

In FIG. 25, a light source system 101 is composed of an ellipsoidal mirror 112, a light source 111 located at the position of the first focus of the ellipsoidal mirror 112, for example, a mercury lamp or the like emitting a beam (exposure light) such as the g-line (436 nm), the i-line (365 nm), or the h-line (405 nm), and a collimator lens 113. The beam emitted from the light source 111 forms a light source image at the position of the second focus of the ellipsoidal mirror 112 by the light collecting function of the ellipsoidal mirror 112. Light from this light source image is converted into a beam of parallel rays by the collimator lens 113. This collimator beam enters an optical integrator of the fly's eye lens type 102 for forming a plurality of light source images arranged approximately in a square array. Here, the Y-axis is taken in parallel with the optical axis of the illumination optical apparatus, the X-axis is taken perpendicular to the Y-axis and parallel with the plane of FIG. 25, and the Z-axis is taken perpendicular to the Y-axis and to the plane of FIG. 25.

Figure 26:
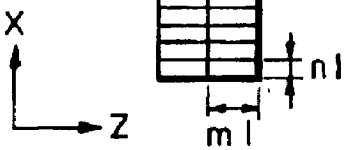
FIG. 26 is a drawing as seen along the optical axis, of a first-stage optical integrator in the illumination optical apparatus of the fourth embodiment.

As shown in FIG. 26, the optical integrator 102 is composed of a plurality of lens elements 102a having a rectangular cross section and arranged in an array of 6 rows in the X direction and 2 columns in the Z direction as bundled in a square outer shape. The cross section of each lens element 102a is shaped as similar to that of a total optical integrator 104 (FIG. 27) as detailed later. Beams incident into the lens elements 102a constituting the optical integrator 102 are condensed to form respective light source images on the exit side of the lens elements 102a. Accordingly, in FIG. 25, a plurality of light source images a number of which corresponds to a number of the lens elements 102a are formed in a nearly square array on the exit plane (exit-focal plane) $A_{41}$ of optical integrator 102, thus substantially forming secondary light sources there.

Figure 27:
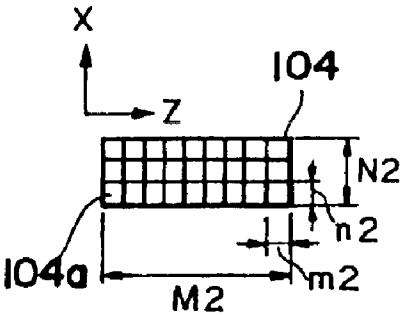
FIG. 27 is a drawing as seen along the optical axis, of a second-stage optical integrator in the illumination optical apparatus of the fourth embodiment.

There is an aperture stop 131 for controlling a quantity of light, having a circular aperture and located near the exit plane $A_{41}$, and beams from secondary light sources in the aperture stop 131 out of the plurality of secondary light sources formed by the optical integrator 102 are converged by a relay optical system 103 composed of lenses 132 and 133 then to enter an optical integrator 104 of the fly's eye lens type for forming a plurality of light source images, arranged in a rectangular array. As shown in FIG. 27, the optical integrator 104 is composed of lens elements 104a each having a nearly square cross section, as arranged in an array of 3 rows in the X direction and 9 columns in the Z direction bundled in a rectangular outer shape. The cross section of each lens element 104a is formed as similar to that of a total optical integrator 106 (FIG. 28) as detailed later. Thus, beams passing through the respective lens elements 104a constituting the optical integrator 104 are converged to form light source images on the exit side of the lens elements 104a. Accordingly, in FIG. 25, a plurality of light source images in a rectangular array are formed on the exit plane $A_{42}$ of the optical integrator 104, thus substantially forming tertiary light sources there.

Figure 28:
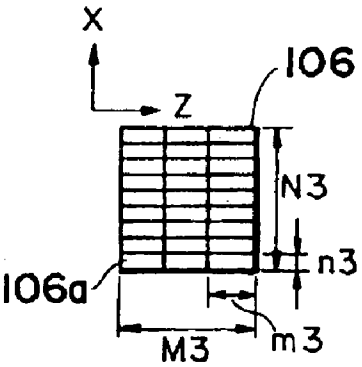
FIG. 28 is a drawing as seen along the optical axis, of a third-stage optical integrator in the illumination optical apparatus of the fourth embodiment.

Beams from the tertiary light sources formed by the optical integrator 104 are converged by a relay optical system 105 composed of lenses 151 and 152 then to enter an optical integrator 106 of the fly's eye lens type for forming a plurality of light source images, arranged in a nearly square array. As shown in FIG. 28, the optical integrator 106 is composed of lens elements 106a, each having a rectangular cross section, as arranged in an array of 9 rows in the X direction and 3 columns in the Z direction bundled in a nearly square outer shape. Beams passing through the respective lens elements 106a constituting the optical integrator 106 are converged to form light source images on the exit side of the lens elements 106a. Accordingly, a plurality of light source images arranged in a square array are formed on the exit plane $A_{43}$ of the optical integrator 106, thus substantially forming quaternary light sources there.

In FIG. 25, a number of light source images in a square array formed on the exit plane $A_{43}$ of optical integrator 106 is L×M×N where L is the number of lens elements 102a constituting the optical integrator 102, M the number of lens elements 104a constituting the optical integrator 104, and N the number of lens elements 106a constituting the optical integrator 106.

Here, the relay optical system 103 is arranged to make the entrance plane $B_{41}$ of optical integrator 102 optical conjugate with the entrance plane $B_{42}$ of optical integrator 104 and to make the exit plane $A_{41}$ of optical integrator 102 optically conjugate with the exit plane $A_{42}$ of optical integrator 104. Also, the relay optical system 105 is arranged to make the entrance plane $B_{42}$ of optical integrator 104 optically conjugate with the entrance plane $B_{43}$ of optical integrator 106 and to make the exit plane of optical integrator 104 optically conjugate with the exit plane $A_{43}$ of optical integrator 106.

Beams from the quaternary light sources distributed in a nearly square shape and formed by the optical integrator 106 pass through a circular aperture in an aperture stop 171 located immediately after the exit plane $A_{43}$ of optical integrator 106 to change into beams of a circular cross section. Beams having passed through the aperture stop 171 pass through a condenser optical system 107 composed of lenses 172 and 173 then to illuminate a rectangular illumination region 108a on the pattern-formed plane of reticle R provided on the illuminated surface R1. The condenser optical system 107 is arranged in such a manner that the front focal point thereof is coincident with the exit plane (exit focal plane.) $A_{43}$ of optical integrator 106 and the rear focal point thereof is coincident with the illuminated surface R1. Thus, the beams from the plurality of light source images formed by the optical integrator 106 illuminate the illuminated surface R1 with a uniform illuminance distribution in a superimposed manner by the light condensing function of condenser optical system 107. On this occasion, the quantity of light is controlled on the illuminated surface R1 by exchanging the aperture stop 131 immediately after the first-stage optical integrator 102 for another or by controlling the diameter of aperture in the aperture stop 131.

Figure 29:
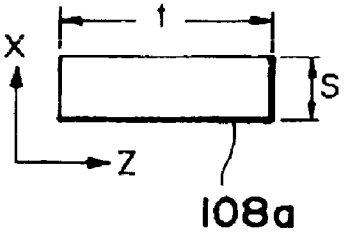
FIG. 29 is a drawing as seen along the optical axis, of an illumination region on an illuminated surface.

Next described are the functions of the three optical integrators 102, 104, and 106 in the present embodiment. First, the illumination region 108a on the illuminated surface R1 has a rectangular shape extending in the Z direction, as shown in FIG. 29, and a pattern in the illumination region 108a is projected onto an unrepresented wafer through an unrepresented projection optical system to be printed. In this case, the reticle R is moved in the X direction, i.e., in the transverse direction to the illumination region 108a, and the wafer in the direction conjugate therewith, whereby the entire pattern of reticle R is transferred onto a shot area in the wafer.

Figure 32:
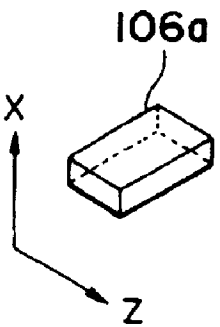
FIG. 32 is a perspective view to show a lens element in the third-stage optical integrator.

The condenser optical system 107 makes the rectangular illumination region 108a conjugate with the entrance plane $B_{43}$ of the lens elements 106a in the optical integrator 106. Then, the cross section of each lens element 106a needs to have a rectangular shape similar to (or conjugate with) the illumination region 108a in order to illuminate the illumination region 108a with most of the beam incident into each lens element 106a, which is satisfied by the present embodiment as already described. Specifically, the shape of each lens element 106a is a rectangular parallelepiped as shown in FIG. 32. By this, the beams incident into the optical integrator 106 are efficiently projected onto the illumination region 108a.

Further, the cross section of the entire optical integrator 106 is square, the reason of which is as follows. The square figure is selected as a figure circumscribing the circular aperture or the circumference of the aperture in the aperture stop 171 used in the present embodiment, because the aperture is normally a circular aperture, a ring aperture, or a plurality of small circular apertures inscribing a circumference.

Summarizing the above, the next relation (8) is preferably satisfied in the present embodiment, where in FIG. 25, t is the longitudinal (Z-directional) length of the rectangular illumination region 108a, s the transverse (X-directional) length thereof, m3 the Z-directional (longitudinal) length of each lens element 106a in the optical integrator 106, and n3 the X-directional (transverse) length thereof.

$$m3/n3=s/t \tag{8}$$

Figure 31:
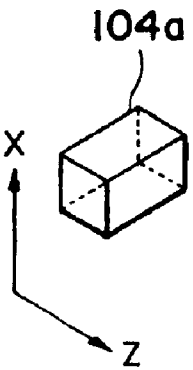
FIG. 31 is a perspective view to show a lens element in the second-stage optical integrator.

Next, the relay lens system 105 makes the entrance plane $B_{43}$ of optical integrator 106 conjugate with the entrance plane $B_{42}$ of each lens element 104a in the optical integrator 104. Thus, in order to make most of the beams having entered the lens elements 104a incident into the entrance end plane of optical integrator 106, each lens element 104a needs to have a square cross section similar to (or conjugate with) the cross section of optical integrator 106, which is satisfied by the present embodiment as already described. Specifically, the cross section of each lens element 104a is a regular quadrangular prism as shown in FIG. 31. By this, the beams having entered the optical integrator 104 are made efficiently incident into the optical integrator 106.

Further, the cross section of the entire optical integrator 104 is rectangular, which is determined so as to guide a beam of circular cross section emergent from the collimator lens 113 to the illumination region 108a with good efficiency.

Summarizing the above, the following relation (9) is preferably satisfied where M3 is the Z-directional length of the entire third-stage optical integrator 106, N3 the X-directional length thereof, m2 the Z-directional length of each lens element 104a in the optical integrator 104, and n2 the X-directional length thereof.

$$m2/n2=M3/N3 \tag{9}$$

The cross section of the final-stage optical integrator 106 can be arranged as being nearly circular or of a nearly regular hexagon because of the circular aperture in the aperture stop 171, but in this case, the cross section of each lens element 104a in the second-stage optical integrator 104 may be of a regular hexagon so that the cross section of the entire optical integrator 104 is nearly rectangular.

Figure 30:
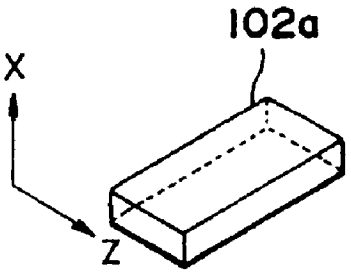
FIG. 30 is a perspective view to show a lens element in the first-stage optical integrator.

Further, the relay lens system 103 makes the entrance plane $B_{42}$ of optical integrator 104 conjugate with the entrance plane $B_{41}$ of each lens element 102a in the optical integrator 102. Thus, in order to make most of the beams having entered each lens element 102a incident into the entrance end plane of optical integrator 104, each lens element 102a needs to have a rectangular cross section similar to (or conjugate with) the cross section of optical integrator 104, which is satisfied by the present embodiment as already described. Specifically, each lens element 102a is a rectangular parallelepiped as shown in FIG. 30. By this, the beams having entered the optical integrator 102 are incident into the optical integrator 104 with good efficiency.

Further, the cross section of the entire optical integrator 102 is square, which is determined to efficiently receive the beam of circular cross section emitted from the light source system 101.

Summarizing the above, the following relation (10) is preferably satisfied where M2 is the Z-directional (longitudinal) length of the entire second-stage optical integrator 104, N2 the X-directional (transverse) length thereof, m1 the Z-directional (longitudinal) length of each lens element 102a in the optical integrator 102, and n1 the X-directional (transverse) length thereof.

$$m1/n1=M2/N2 \quad (10)$$

As described, the outer shapes of the respective entire optical integrators 102, 104, and 106 and the cross sections of the respective lens elements can be determined within the ranges satisfying the associated relations of Equation (8), Equation (9), and Equation (10).

Also, as for the uniformity of illuminance distribution, because there are a lot of light source images formed on the exit plane $A_{43}$ of the final-stage optical integrator 106, extremely high uniformity of illuminance distribution is achieved on the illumination region 108a by the superposition effect. As described above, the present embodiment includes the optical integrators set in three stages, whereby the rectangular illumination region 108a is illuminated with a uniform illuminance distribution (Köhler illumination) and with high illumination efficiency by the beam of a nearly circular cross section emitted from the light source system 101.

Now, comparison is made between the case where the two optical integrators are employed as in FIG. 5 and the case where the three optical integrators are employed as in the present embodiment.

Figure 33:
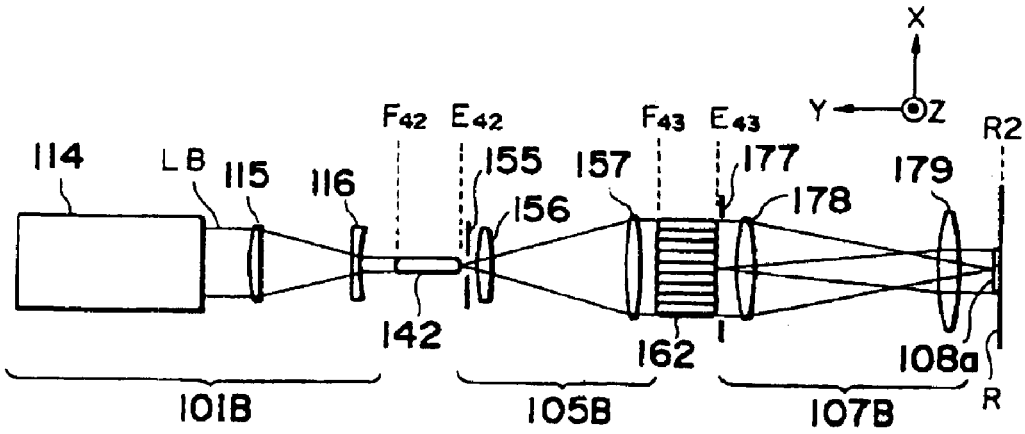
FIG. 33 is a drawing to show an illumination optical apparatus using two stages of optical integrators.
Figure 34:
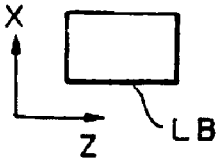
FIG. 34 is a drawing to show a cross section of a beam emitted from an excimer laser light source used in the illumination optical apparatus shown in FIG. 33.

FIG. 33 is equivalent to FIG. 5, which shows a case where an excimer laser source is used as a light source and the optical integrators are of the fly's eye lens type in the illumination optical apparatus using two stages of optical integrators. In a light source system 101B in FIG. 33 a collimated beam LB of a rectangular cross section (FIG. 34) emitted from the excimer laser source 114 passes through a beam shaping optical system composed of cylindrical lenses 115 and 116 to change into a beam of a predetermined cross section.

Figure 35:
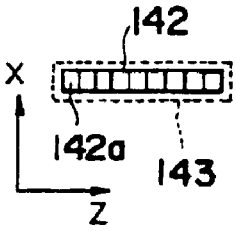
FIG. 35 is a drawing as seen along the optical axis, of a first-stage optical integrator used in the illumination optical apparatus shown in FIG. 33.
Figure 36:
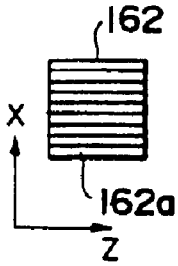
FIG. 36 is a drawing as seen along the optical axis, of a second-stage optical integrator used in the illumination optical apparatus shown in FIG. 33.

The beam emitted from the light source system 101B is incident into an optical integrator 142 composed of a plurality of lens elements 142a, each having a square lens cross section as shown in FIG. 35, arranged in an array of one row in the direction perpendicular to the plane of FIG. 33. Thus, light source images are formed in an array of one row aligning in the direction perpendicular to the plane of FIG. 33 on the exit plane $E_{42}$ of the optical integrator 142. An aperture stop 155 having a circular aperture is set near the exit plane $E_{42}$. Beams from a plurality of light source images in the aperture stop 155 pass through a relay optical system 105B composed of lenses 156 and 157 and thereafter enter an optical integrator 162 composed of a plurality of lens elements 162a, each having a rectangular lens cross section as shown in FIG. 36, arranged in a square array.

Figure 37:
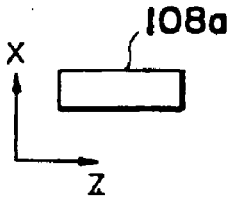
FIG. 37 is a drawing as seen along the optical axis, of an illumination region on an illuminated surface in the illumination optical apparatus shown in FIG. 33.

A plurality of light source images are formed in a square array on the exit plane $E_{43}$ of optical integrator 162 by the converging function thereof. An aperture stop 177 having a circular aperture is set at the position of the light source images. Beams from the plurality of light source images circularly shaped by the aperture stop 177 pass through a condenser optical system 107B composed of lenses 178 and 179 then to illuminate a rectangular illumination region 108a (FIG. 37) on the illuminated surface R2 of reticle R. This condenser optical system 107B is so arranged that the front focal point thereof is coincident with the exit plane $E_{43}$ of optical integrator 162 and that the rear focal point is coincident with the illuminated surface R2 of reticle R. By this, beams from the plurality of light source images formed by the optical integrator 162 uniformly illuminate the illumination region 108a on the reticle R in a superimposed manner by the light condensing function of condenser optical system 107B.

A quantity of light on the illumination region 108a of reticle R is controlled by exchanging the aperture stop 155 immediately after the optical integrator 142 for another or by changing the aperture diameter of the aperture stop 155.

However, if the example of FIG. 33 employs the light source system 101 of FIG. 25 instead of the light source system 101B, a loss in quantity of light is caused on the entrance plane of optical integrator 142 because the cross section of the beam from the light source system 101 is circular. In contrast, because the present embodiment of FIG. 25 employs the first-stage optical integrator 102 of square cross section, the loss in quantity of light in the first-stage optical integrator 102 is small.

Next, comparison is made as to the control of light quantity on the illuminated surface. In the example of FIG. 33, the quantity of light is controlled by the aperture stop 155 immediately after the optical integrator 142. In this case, because the optical integrator 142 is rectangular, limiting of the beam therefrom by the circular aperture of aperture stop 155 changes the size of images formed on the exit plane of lens elements 162a in the optical integrator 162, of the light source images on the exit plane of optical integrator 142. Also, where the illumination optical apparatus of FIG. 33 is applied to a projection exposure apparatus, the setting plane of the aperture stop 155 is conjugate with the plane of the pupil of the projection optical system.

Then, a change in aperture diameter of aperture stop 155 would locally change the light source images formed on the pupil plane of projection optical system, which could degrade the imaging performance. When the lens elements 162a in the optical integrator 162 are arranged in the number of N1 (in the X-direction)×N2 (in the Z direction), spatial periods in the X direction and in the Y direction, of the local change of light source images formed on the pupil plane of projection optical system are (N1, N2).

On the other hand, the present embodiment shown in FIG. 25 is so arranged that the three stages of optical integrators are arranged in series and that the aperture stop 131 for controlling the quantity of light is set immediately after the exit plane of the first-stage optical integrator 102. When the number of lens elements in the optical integrator 104 is M1 (in the X direction)×M2 (in the Z direction) and when the array in the optical integrator 106 is N1×N2, spatial periods in the X direction and in the Z direction, of the local change of light source images formed on the pupil plane of projection optical system are (M 1×N2, M1×N2), thus localizing a change of luminance of light source images formed on the pupil plane of projection optical system and presenting an advantage that the imaging performance of projection optical system can be prevented from being degraded.

Embodiment 5

Figure 38:
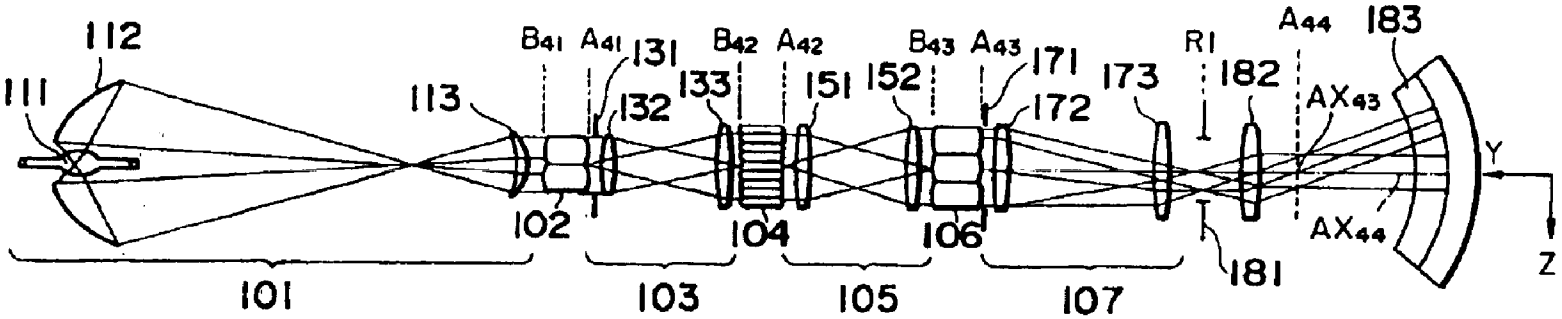
FIG. 38 is a plan view of an illumination optical apparatus of the fifth embodiment.
Figure 39:
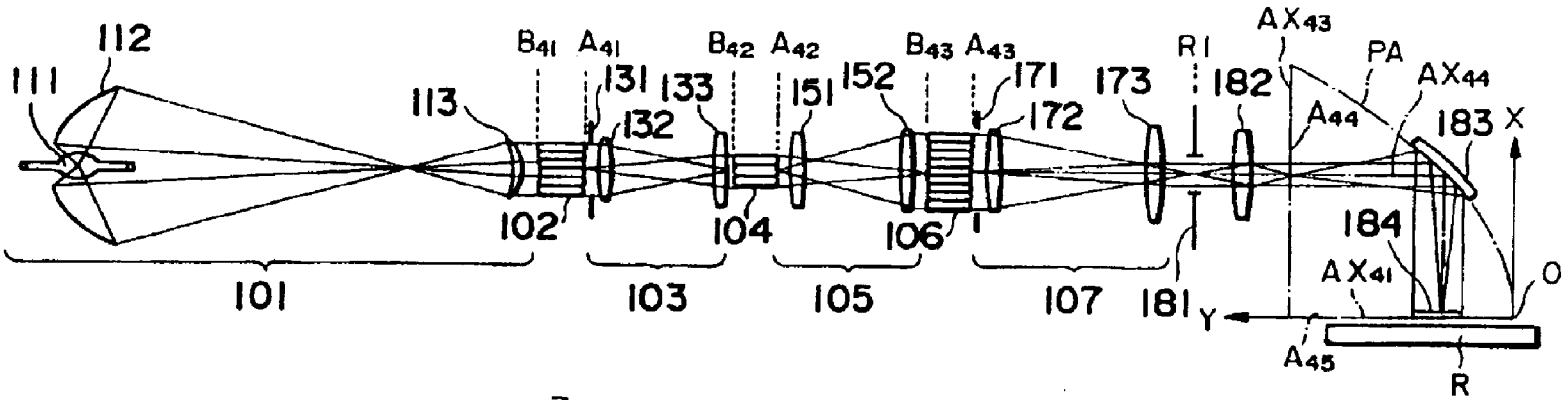
FIG. 39 is a side view of the illumination optical apparatus of the fifth embodiment.

The fifth embodiment of the present invention is next described referring to FIGS. 38 and 39. The present embodiment is an example to illuminate an arcuate illumination region, utilizing the embodiment of FIG. 25. In FIGS. 38 and 39, portions corresponding to those in FIG. 25 are denoted by the same reference numerals and are omitted to explain herein.

Figure 40:
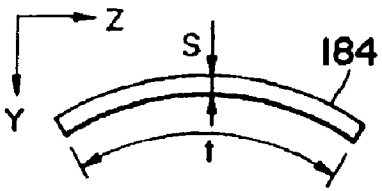
FIG. 40 is a drawing to show a final illumination region in the illumination optical apparatus of the fifth embodiment.

FIG. 38 is a plan view of an illumination optical apparatus of the present embodiment and FIG. 39 a side view of the illumination optical apparatus. In FIGS. 38 and 39, a rectangular illumination region on an illuminated surface R1 is illuminated with a distribution of uniform illuminance. In the present embodiment a field stop 181 is set on the illuminated surface R1. The aperture in the field stop 181 is of a rectangular shape smaller than the rectangular illumination region, and the shape of the aperture in the field stop 181 determines the final shape (size) of the arcuate illumination region 184 (FIG. 40).

Beams having passed through the aperture in the field stop 181 pass through a relay lens 182 then to enter a toric reflective mirror 183. In this case, when the front focal point of the relay lens 182 is coincident with the setting plane of the field stop 181 and when the rear focal point of relay lens 182 is on the plane $A_{44}$, the plane $A_{44}$ is conjugate with the exit plane $A_{43}$ of optical integrator 106, and a lot of light source images are formed on the plane $A_{44}$.

In this case, the optical axis $AX_{44}$ of optical integrator 106 resides in the planes of FIG. 38 and FIG. 39 as being perpendicular to the plane $A_{44}$ on which the light source images are formed. Using a certain constant $\alpha$, a plane $A_{45}$ is set at a position a distance of $1/(2\alpha)$ away from the optical axis $AX_{44}$ as being perpendicular to the plane $A_{44}$, the Y-axis is taken in the direction parallel with the plane of FIG. 39 in the plane $A_{45}$, and the Z-axis is taken perpendicular to the Y-axis in the plane $A_{45}$. Further, the origin O is set at a position a distance of $3/(4\alpha)$ away from the plane $A_{44}$ on the Y-axis, and the X-axis is taken perpendicular to the YZ plane as passing the origin O.

Next, let us consider a parabola PA defined by $Y=\alpha X^2$ using the above constant $\alpha$ in the XY plane, as shown in FIG. 39. The symmetry axis $AX_{41}$ of the parabola PA is nothing but the Y-axis. A parabolic toric surface of revolution is formed by rotating the parabola PA about a reference axis $AX_{43}$ passing the optical axis $AX_{44}$ in the plane $A_{44}$ and being perpendicular to the Y-axis, and the reflective surface of the toric reflective mirror 183 is determined in the region surrounded by two latitudes and two longitudes on the parabolic toric surface of revolution with the center at a point of intersection between the parabolic toric surface of revolution and the optical axis $AX_{44}$. A dielectric multilayer film is formed on the reflective surface of the toric reflective mirror 183 to enhance the reflectivity for a beam of a wavelength band supplied from the light source system 101.

In this case, rays from a point in the light source images on the plane $A_{44}$ are converted into parallel rays, as shown by the solid lines, by the toric reflective mirror 183, then forming the arcuate illumination region 184 on the plane $A_{45}$ while maintaining the telecentricity. On the other hand, rays parallel with the optical axis $AX_{44}$ are reflected by the toric reflective mirror 183 and thereafter pass a position a distance of $1/(4\alpha)$ away from the origin O on the Y-axis on the plane $A_{45}$, i.e., a distance of $1/(2\alpha)$ away from the plane $A_{44}$, thus forming the illumination region 184 around that position.

In FIGS. 38 and 39, the focal length f of the toric reflective mirror 183 is $1/(2\alpha)$, the entrance pupil (light-source side focal point) of the toric reflective mirror 183 is located on the plane $A_{44}$ which is the plane where the light source images are formed, and the illuminated-object-side focal point of the toric reflective mirror 183 is on the plane $A_{45}$. The pattern-formed surface of reticle R is set on the plane $A_{45}$, on which the arcuate illumination region 184 is formed. The reticle R is moved by an unrepresented reticle stage at a constant speed in the direction parallel with the Y-axis (i.e., in the transverse direction) relative to the arcuate illumination region 184. There is a 1:1 bitelecentric projection optical system (not shown) of the mirror projection type provided below the reticle R, for example. Since the projection optical system of the mirror projection type has a best image region of arcuate shape, the illumination region on the reticle R should be preferably made arcuate. An image of a pattern in the reticle R inside the illumination region 184 is projected through the projection optical system onto the wafer W moved in synchronization with the reticle R. By this, the pattern of reticle R is successively transferred onto the wafer by the scan exposure method.

As described above, the present embodiment is so arranged that the toric reflective mirror 183 is set after the relay optical system 107, whereby the arcuate illumination region 184 on the reticle R can be finally illuminated with uniformity of illuminance distribution and with high illumination efficiency.

The arcuate illumination region 184 as shown in FIG. 40 is formed on the reticle R by the toric reflective mirror 183 in the present embodiment and the optical integrator 106 is preferably arranged to satisfy the previously described relation of Equation (8), where s is the width of the central portion of the arcuate illumination region 184, t is the length of arc (chord) of the arcuate illumination region 184, m3 the Z-directional (longitudinal) length of each lens element 106a in the optical integrator 106, and n3 the X-directional (transverse) length of each lens element 106a in the optical integrator 106. Also, the relative relation between the optical integrator 106 and the optical integrator 104 preferably satisfies the previously described relation of Equation (9). Further, the relative relation between the optical integrator 104 and the optical integrator 102 preferably satisfy the previously described relation of Equation (10).

Embodiment 6

Figure 41:
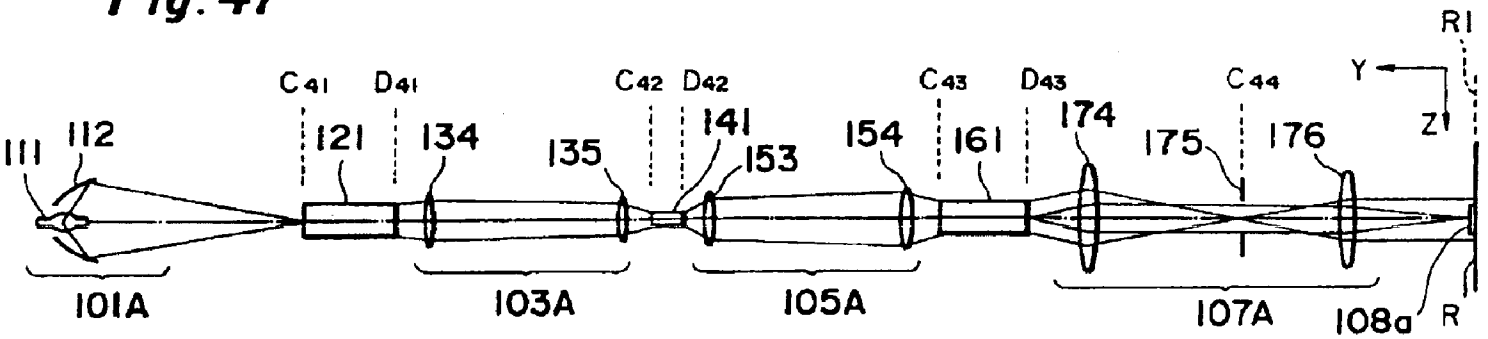
FIG. 41 is a plan view of an illumination optical apparatus of the sixth embodiment.
Figure 42:
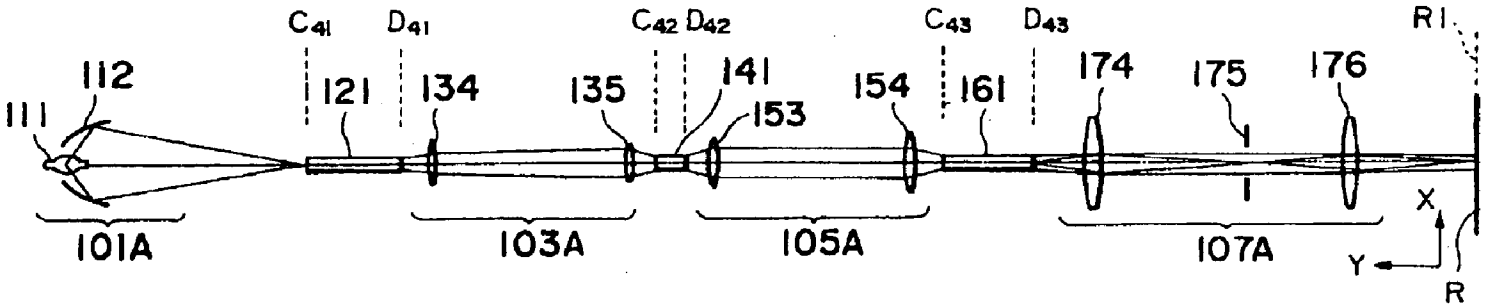
FIG. 42 is a side view of the illumination optical apparatus of the sixth embodiment.

The sixth embodiment of the present invention is next described referring to FIGS. 41 and 42. The present embodiment is an example in which internal reflection type integrators for example of glass rods or the like are used as optical integrators to illuminate a rectangular illumination region. In FIGS. 41 and 42, portions corresponding to those in FIG. 25 are denoted by the same reference numerals and omitted to explain herein.

FIG. 41 is a plan view of an illumination optical apparatus of the present embodiment and FIG. 42 a side view of the illumination optical apparatus. In FIGS. 41 and 42, the Z-axis and the X-axis are taken along the longitudinal direction and along the transverse direction, respectively, of the rectangular illumination region 108a on the illuminated surface R1, and the Y-axis is taken in parallel with the optical axis.

As shown in FIGS. 41 and 42, a light source system 101A is composed of an ellipsoidal mirror 112, and a light source 111 located at the position of the first focus of the ellipsoidal mirror 112, which is a mercury lamp emitting a beam of the g-line (436 nm), the i-line (365 nm), or the h-line (407 nm), for example. In the light source system 101A, light from the light source 111 is collected by the light collecting function of the ellipsoidal mirror 112 to form a light source image at the position of the second focus of the ellipsoidal mirror 112.

Figure 43:
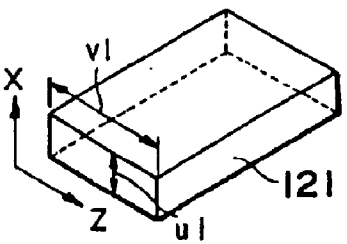
FIG. 43 is a perspective view to show a first-stage internal reflection type integrator in the illumination optical apparatus of the sixth embodiment.

The second focus of the ellipsoidal mirror 112 is arranged to be located on the entrance end plane $C_{41}$ of an optical member 121 (FIG. 43) of the internal reflection type having a rectangular cross section, as first multi-light-source-image forming means, so that a light source image is formed on the entrance end plane $C_{41}$ of optical member 121. The optical member 121 is made for example of a glass rod. A beam from the light source image repeats internal reflection in the optical member 121 to be outgoing from the exit end plane $D_{41}$ of optical member 121. At this moment, a plurality of light source images (virtual images) are formed in a square array on the entrance side plane $C_{41}$ of optical member 121, so that beams are emitted from the exit end plane $D_{41}$ of optical member 121 as if there are a plurality of light source images on the entrance end plane $C_{41}$ of optical member 121.

Figure 44:
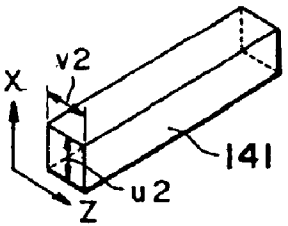
FIG. 44 is a perspective view to show a second-stage internal reflection type integrator in the illumination optical apparatus of the sixth embodiment.

Beams outgoing from the internal reflection type optical member 121 pass through a relay optical system 103A composed of lenses 134 and 135 and thereafter are incident into an optical member 141 of the internal reflection type (FIG. 44) having a square cross section as second multi-light-source-image forming means.

This relay optical system 103A is arranged to make the entrance end plane $C_{41}$ of optical member 121 optically conjugate with the entrance end plane $C_{42}$ of optical member 141 and to make the exit end plane $D_{41}$ of optical member 121 optically conjugate with the exit end plane $D_{42}$ of optical member 141.

By this, the beams from the plurality of light source images formed in a square distribution on the entrance end plane $C_{41}$ of optical member 121 form a plurality of light source images in a square distribution on the entrance end plane $C_{41}$ of optical member 141.

Beams from the light source images repeat internal reflection in the optical member 141 to be outgoing from the exit end plane $D_{42}$ of optical member 141. At this moment a plurality of light source images (virtual images) distributed in a rectangular shape are formed on the entrance end plane $C_{42}$ of optical member 141, and beams are emitted from the exit end plane $D_{42}$ of optical member 141 as if there are a plurality of light source images on the entrance end plane $C_{42}$ of optical member 141.

Figure 45:
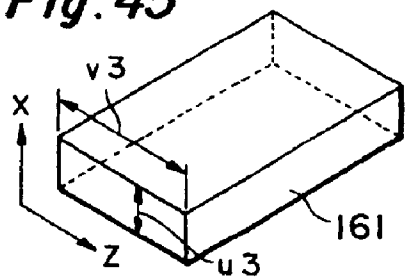
FIG. 45 is a perspective view to show a third-stage internal reflection type integrator in the illumination optical apparatus of the sixth embodiment.

Beams outgoing from the exit end plane $D_{42}$ of optical member 141 pass through a relay optical system 105A composed of lenses 153 and 154 then to enter an optical member 161 of the internal reflection type (FIG. 45) having a rectangular cross section, as third multi-light-source-image forming means.

This relay optical system 105A is arranged to make the entrance end plane $C_{42}$ of optical member 141 optically conjugate with the entrance end plane $C_{43}$ of optical member 161 and to make the exit end plane $D_{42}$ of optical member 141 optically conjugate with the exit end plane $D_{43}$ of optical member 161. By this, beams from the plurality of light source images formed on the entrance end plane $C_{42}$ of optical member 141 form a plurality of light source images (real images) distributed in a rectangular shape on the entrance end plane $C_{42}$ of optical member 161.

Beams from the plurality of light source images formed on the entrance end plane $C_{43}$ of this optical member 161 repeat internal reflection in the optical member 161 to be then outgoing from the exit end plane $D_{43}$ of optical member 161. At this moment a plurality of light source images (virtual images) are formed on the entrance end plane $C_{43}$ of optical member 161. Combining the light source images thus formed with a plurality of light source images (real images) directly formed by the beams from the optical member 141, a plurality of light source images are formed in a square distribution in total. Beams are emitted from the exit end plane $D_{43}$ of optical member 161 as if there are a plurality of light source images on the entrance end plane $C_{43}$ of optical member 161.

Beams outgoing from the optical member 161 pass through a condenser lens 174 in a condenser optical system 107A and thereafter are incident into an aperture stop 175 having a circular aperture. The condenser lens 174 is so arranged that the front focal point thereof is coincident with the exit end plane $D_{43}$ of optical member 161, and the condenser lens 174 is arranged to make the entrance end plane $C_{43}$ of optical member 161 conjugate with the setting plane $C_{44}$ of aperture stop 175. By this, light source images are formed in a square distribution on the setting plane of aperture stop 175, which are converted into a plurality of light source images distributed in a circular region, for example by a circular aperture in the aperture stop 175.

Beams from the light source images inside the aperture of the aperture stop 175 are condensed by the condenser lens 176 to illuminate the illumination region 108a on the illuminated surface R1 of reticle R. The condenser lens 176 is so arranged that the front focal point thereof is coincident with the setting plane $C_{44}$ of aperture stop 175 and that the rear focal point thereof is coincident with the illuminated surface R1. By this, beams from the light source images formed on the setting plane $C_{44}$ of aperture stop 175 illuminate the rectangular illumination region 108a on the illuminated surface R with uniform illuminance and in a superimposed manner.

Since the present embodiment is so arranged that the exit end plane $D_{43}$ of optical member 161 conjugate with the rectangular illumination region 108a is of a rectangle shape similar to (or conjugate with) the illumination region 108a, the beams outgoing from the optical member 161 illuminate the illumination region 108a with good efficiency. Also, the two stages of optical members 141 and 161 enhance the uniformity of distribution of illuminance in the X direction and in the Z direction on the illumination region 108a. In addition, because images of the light source 111 are formed in the central region of the entrance exit plane $C_{41}$ of the first-stage optical member 121, there is an advantage that no loss in quantity of light occurs even if the cross section of the beam supplied from the light source system 101A is circular.

Here is described an example of optimum construction for the optical members 121, 141, 161 used in the present embodiment. First, because the illumination region 108a is conjugate with the exit end plane of optical member 161, the below relation (11) is preferably satisfied, where t is the longitudinal (Z-directional) length of the illumination region 108a, s the transverse (X-directional) length thereof, v3 the Z-directional (longitudinal) length of the third-stage optical member 161, and u3 the X-directional (transverse) length thereof.

$$s/t=u3/v3 \tag{11}$$

Also, the following relation of Equation (12) is preferably satisfied, where $\beta_{5A}$ is an image magnification of relay optical system 105A, v2 the Z-directional length of the second-stage optical member 141, and u2 the X-directional length thereof. Here, the relation of v2=u2 holds in the present embodiment.

$$u2=\beta_{5A}\cdot u3 \quad (12)$$

Further, the following relation of Equation (13) is preferably satisfied, where $\beta_{3A}$ is an image magnification of relay optical system 103A, v1 the Z-directional (longitudinal) length of the first-stage optical member 121, and u1 the X-directional (transverse) length thereof. Here, the relation of v2=u2 holds in the present embodiment.

$$u1=\beta_{3A}\cdot u2 \quad (13)$$

Since these relations hold, the illumination region 108a is illuminated with high illumination efficiency and with high uniformity of illuminance distribution (Köhler illumination)

The optical members 121, 141, 161 may be not only the rod glass but also optical members of the internal reflection type of hollow prism.

In the present invention, it is of course that the optical integrators of the fly's eye lens type can be used in combination with the optical members of the internal reflection type.

Further, although the above embodiments used the light source system which was the system for collecting a light beam from the light source such a mercury lamp by the ellipsoidal mirror, the light source system may employ a laser light source, for example. Even with use of the laser light source, where the cross section of a beam emitted from the laser light source is nearly circular, both the condition of uniformity of illuminance distribution and the condition of illumination efficiency can be satisfied by using the three stages of optical integrators.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 295458/1992 filed on Nov. 5, 1992, 19098/1993 filed on Feb. 5, 1993 and 51490/1994 filed on Mar. 23, 1994 are hereby incorporated by reference.

What is claimed is:

1. An illumination optical apparatus comprising:

a light supply means for supplying a beam;

a light-source-image forming means for forming a plurality of light source images which are substantially linearly arranged in at least one line, based on the beam from said light supply means;

an optical integrator having a plurality of lens elements for forming a plurality of light source images, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof; and a first relay optical system disposed between said light-source-image forming means and said optical integrator, for making a position of the light source images formed by said light-source-image forming means conjugate with a position of the light source images formed by said optical integrator said light supply means including:

a light source system for emitting light having a beam cross section of substantially square or circle;

light source changing means for forming a plurality of light source images, based on the light from said light source system; and a second relay optical system located between said light source changing means and said light-source-image forming means, for making a position of the light source images formed by said light source changing means conjugate with a position of the light source images formed by said light-source-image forming means.

2. An illumination optical apparatus according to claim 1, wherein said light-source-image forming means is an optical integrator having a plurality of lens elements arranged in at least one line, said lens elements having a same refracting power both in the direction in which said lens elements arranged and in the direction perpendicular to the direction in which said lens element arranged.

3. An illumination optical apparatus according to claim 1, wherein the ratio of height to width of said optical integrator of said light-source-image forming means along a plane perpendicular to an optical axis of said apparatus is the same as the ratio of longitudinal and transverse length of each lens element of said optical integrator for forming light source images based on beam from said light-source-image forming means.

4. A method of fabricating a semiconductor device using an illumination optical apparatus according to claim 3, said method comprising the steps of:

guiding a light from said illumination apparatus to a mask on which a predetermined circuit pattern is formed and illuminating the pattern; and with moving said mask and photo-sensitive substrate in predetermined directions respectively, projecting said pattern of the mask on the sensitive substrate.

5. An illumination optical apparatus according to claim 1, wherein said light source changing means is provided with a plurality of lens elements having a rectangular cross section.

6. An illumination optical apparatus according to claim 1, wherein said light source changing means is an internal reflection type integrator.

7. A method of fabricating a semiconductor device using an illumination optical apparatus according to claim 1, said method comprising the steps of:

guiding a light from said illumination apparatus to a mask on which a predetermined circuit pattern is formed and illuminating the pattern; and with moving said mask and photo-sensitive substrate in predetermined directions respectively, projecting said pattern of the mask on the sensitive substrate.

8. An illumination optical apparatus comprising:

a light supply means for supplying a beam;

a light-source-image forming means for forming a plurality of light source images which are substantially linearly arranged in at least one line, based on the beam from said light supply means;

an internal reflection type integrator having two reflection planes parallel to each other for forming a plurality of light source images, based on the beam from said light-source-image forming means, said internal reflection type integrator having a rectangular cross section, two sides adjacent to each other of said rectangular cross section being different in length; and a first relay optical system disposed between said light-source-image forming means and said internal reflection type integrator, for making a position of the light source images formed by said light-source-image forming means conjugate with a position of the light source images formed by said internal reflection type integrator, said light supply means including:

a light source system for emitting light having a beam cross section of substantially square or circle;

light source changing means for forming a plurality of light source images, based on the light from said light source system; and a second relay optical system located between said light source changing means and said light-source-image forming means, for making a position of the light source images formed by said light source changing means conjugate with a position of the light source images formed by said light-source-image forming means.

9. An illumination optical apparatus according to claim 8, wherein said light source changing means is provided with a plurality of lens elements having a rectangular cross section.

10. An illumination optical apparatus according to claim 8, wherein said light source changing means is an internal reflection type integrator.

11. A method of fabricating a semiconductor device using an illumination optical apparatus according to claim 8, said method comprising the steps of:

guiding a light from said illumination apparatus to a mask on which a predetermined circuit pattern is formed and illuminating the patter; and with moving said mask and photo-sensitive substrate in predetermined directions respectively, projecting said pattern of the mask on the sensitive substrate.

12. An illumination optical apparatus comprising:

a light supply means for supplying a beam;

a light-source-image forming means for forming a plurality of light source images which are substatially linearly arranged in at least one line, based on the beam from said light supply means;

an optical integrator having a plurality of lens elements for forming a plurality of light source images, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof; and a relay optical system disposed between said light-source-image forming means and said optical integrator, for making a position of the light source images formed by said light-source-image forming means conjugate with a position of the light source images formed by said optical integrator, said light supply means comprising:

a collector mirror having an ellipsoidal surface of revolution;

a light source located at one focal point of said ellipsoidal surface of revolution so that light emitted therefrom is reflected and collected by said collector mirror;

a collimator lens for converting light collecting by said collector mirror into substantially parallel beams.

13. An illumination optical apparatus comprising:

a light supply means for supplying a beam;

a light-source-image forming means for forming a plurality of light source images which are substatially linearly arranged in at least one line, based on the beam from said light supply means;

an internal reflection type integrator having two reflection planes parallel to each other for forming a plurality of light source images, based on the beam from said light-source-image forming means, said internal reflection type integrator having a rectangular cross section, two sides adjacent to each other of said rectangular cross section being different in length; and a relay optical system disposed between said light-source-image forming means and said internal reflection type integrator, for making a position of the light source images formed by said light-source-image forming means conjugate with a position of the light source images formed by said internal reflection type integrator, wherein said light supply means comprising:

a collector mirror having an ellipsoidal surface of revolution;

a light source located at one focal point of said ellipsoidal surface of revolution so that light emitted therefrom is reflected and collected by said collector mirror; and a collimator lens for converting light collected by said collector mirror into substantially parallel beams.

14. An illumination optical apparatus comprising:

a light supply means for supplying a beam;

a light-source-image forming means for forming a plurality of light source images which are substatially linealy arranged in at least one line, based on the beam from said light supply means;

an optical integrator having a plurality of lens elements for forming a plurality of light source images, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof; and a relay optical system disposed between said light-source-image forming means and said optical integrator, for making a position of the light source images formed by said light-source-image forming means conjugate with a position of the light source images formed by said optical integrator, said light supply means comprising:

a collector mirror having an ellipsoidal surface of revolution; and a light source located at a first focal point of said ellipsoidal surface of revolution so that light emitted therefrom is reflected and collected by said collector mirror.

15. An illumination optical apparatus comprising:

a light supply means for supplying a beam;

a light-source-image forming means for forming a plurality of light source images which are substantially linealy arranged in at least one line, based on the beam from said light supply means;

an internal reflection type integrator having two reflection planes parallel to each other for forming a plurality of light source images, based on the beam from said light-source-image forming means, said internal reflection type integrator having a rectangular cross section, two sides adjacent to each other of said rectangular cross section being different in length; and a relay optical system disposed between said light-source-image forming means and said internal reflection type integrator, for making a position of the light source images formed by said light-source-image forming means conjugate with a position of the light source images formed by said internal reflection type integrator, said light supply means comprising:

a collector mirror having an ellipsoidal surface of revolution; and a light source located at a first focal point of said ellipsoidal surface of revolution so that light emitted therefrom is reflected and collected by said collector mirror.

16. A scanning exposure apparatus comprising:

a light supply means for supplying a beam;

a light-source-image forming means for forming a plurality of light source images which are substantially linerly arranged in at least one line, based on the beam from said light supply means;

an optical integrator having a plurality of lens elements for forming a plurality of light source images, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof;

a first relay optical system disposed between said light-source-image forming means and said optical integrator, for making a position of the light source images formed by said light-source-image forming means conjugate with a position of the light source images formed by said optical integrator;

a condenser optical system for condensing the beam from said optical integrator to illuminate a surface of a reticle;

a reticle stage for moving said reticle in a direction parallel to said surface of reticle;

a wafer stage for carrying a wafer on which integrated circuits are to be formed, and moving said wafer in a direction parallel to a surface of said wafer; and a projection optical system disposed between said reticle and said wafer, for making a position at which said reticle is located conjugate with a position at which said wafer is located, said light supply means including:

a light source system for emitting light having a beam cross section of substantially square or circle;

light source changing means for forming a plurality of light source images, based on the light from said light source system; and a second relay optical system located between said light source changing means and said light-source-image forming means, for making a position of the light source images formed by said light source changing means conjugate with a position of the light source images formed by said light-source-image forming means.

17. A scanning exposure apparatus according to claim 16, wherein said reticle stage moves said reticle in a direction perpendicular to an optical axis of said apparatus and along a short side of a rectangular configuration of each lens element of said optical integrator, and said wafer stage moves said wafer in a direction perpendicular to an optical axis of said apparatus and along a short side of a rectangular sectional configuration of each lens element of said optical integrator.

18. A method of fabricating a semiconductor device using a scanning exposure apparatus according to claim 17, said method comprising the steps of:

guiding a light from said condenser optical system to a said reticle and illuminating said reticle; and with moving said reticle stage and said wafer stage in predetermined directions respectively, projecting a pattern of said reticle on said wafer to perform the exposure.

19. A scanning exposure apparatus according to claim 16, wherein said light-source-image forming means comprises an optical integrator having a plurality of lens elements arranged in at least one line.

20. A scanning exposure apparatus according to claim 19, wherein the ratio of height to width of said optical integrator of said light-source-image forming means along a plane perpendicular to an optical axis of said optical integrator is proportional to the ratio of longitudinal and transverse length of each lens element of said optical integrator for forming light source images based on the beam from said light-source-image forming means.

21. A scanning exposure apparatus according to claim 20, wherein said reticle stage moves said reticle in a direction perpendicular to an optical axis of said apparatus and along a short side of a rectangular configuration of each lens element of said optical integrator, and said wafer stage moves said wafer in a direction perpendicular to an optical axis of said apparatus and along a short side of a rectangular sectional configuration of each lens element of said optical integrator.

22. A method of fabricating a semiconductor device using a scanning exposure apparatus according to claim 20, said method comprising the steps of:

guiding a light from said condenser optical system to a said reticle and illuminating said reticle; and with moving said reticle stage and said wafer stage in predetermined directions respectively, projecting a pattern of said reticle on said wafer to perform the exposure.

23. A scanning exposure apparatus comprising:

a light supply means for supplying a beam;

a light-source-image forming means for forming a plurality of light source images which are substantially and linearly arranged in at least one line, based on the beam from said light supply means;

an internal reflection type integrator having two reflection planes parallel to each other for forming a plurality of light source images, based on the beam from said light-source-image forming means, said internal reflection type integrator having a rectangular cross section, two sides adjacent to each other of said rectangular cross section being different in length;

a relay optical system disposed between said light-source-image forming means and said integral reflection type integrator, for making a position of the light source images formed by said light-source-image forming means conjugate with a position of the light source images formed by said internal reflection type integrator;

a condenser optical system for condensing the beam from said internal reflection type integrator to illuminate a surface of a reticle;

a reticle stage for moving said reticle in a direction parallel to said surface of reticle;

a wafer stage for carrying a wafer on which integrated circuits are to be formed, and moving said wafer in a direction parallel to a surface of said wafer; and a projection optical system disposed between said reticle and said wafer, for making a position at which said reticle is located conjugate with a position at which said wafer is located, said light supply means including;

a light source system for emitting light having a beam cross section of substantially square or circle;

light source changing means for forming a plurality of light source images, based on the light from said light source system; and a second relay optical system located between said light source changing means and said light-source-image forming means, for making a position of the light source images formed by said light source changing means conjugate with a position of the light source images formed by said light-source-image forming means.

24. An illumination optical apparatus comprising:

a light supply means for supplying a beam;

a light-source-image forming means for forming a plurality of light source images in a substantially linear arrangement, based on the beam from said light supply means;

an optical integrator having a plurality of lens elements for forming a plurality of light source images, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof; and a relay optical system disposed between said light-source-image forming means and said optical integrator, for making a position of the light source images formed by said light-source-image forming means conjugate with a position of the light source images formed by said optical integrator.

25. An illumination optical apparatus according to claim 24, wherein said light-source-image forming means is an optical integrator having a plurality of lens elements arranged in at least one line, said lens elements having a same refracting power both in the direction in which said lens elements arranged and in the direction perpendicular to the direction in which said lens elements arranged.

26. An illumination optical apparatus according to claim 25, wherein the ratio of height to width of said optical integrator of said light-source-image forming means along a plane perpendicular to an optical axis of said apparatus is the same as the ratio of longitudinal and transverse length of each lens element of said optical integrator for forming light source images based on the beam from said light-source-image forming means.

27. An illumination optical apparatus according to claim 24, further comprising: a conversion member for converting plural light-source-images formed by said optical integrator into a light-source-image having a ring shape or a light-source-image of which center is shifted from an optical axis of optical system of said illumination optical apparatus.

28. A method of fabricating a semiconductor device using an illumination optical apparatus according to claim 24, said method comprising the steps of:

guiding a light from said illumination apparatus to a mask on which a predetermined circuit pattern is formed and illuminating the pattern; and with moving said mask and photo-sensitive substrate in predetermined directions respectively, projecting said pattern of the mask on the sensitive substrate.

29. An illumination optical apparatus comprising:

a light supply means for supplying a beam;

a light-source-image forming means for forming a plurality of light source images in a substantially linear arrangement, based on the beam from said light supply means;

an internal reflection type integrator having two reflection planes parallel to each other for forming a plurality of light source images, based on the beam from said light-source-image forming means, said internal reflection type integrator having a rectangular cross section, two sides adjacent to each other of said rectangular cross section being different in length; and a relay optical system disposed between said light-source-image forming means and said internal reflection type integrator, for making a position of the light source images formed by said light-source-image forming means conjugate with a position of the light source images formed by said internal reflection type integrator.

30. An illumination optical apparatus according to claim 29, wherein said light-source-image forming means is an optical integrator having a plurality of lens elements arranged in at least one line, said lens elements having a same refracting power both in the direction in which said lens elements arranged and in the direction perpendicular to the direction in which said lens elements arranged.

31. An illumination optical apparatus according to claim 29, further comprising: a conversion member for converting plural light-source-images formed by said optical integrator into a light-source-image having a ring shape or a light-source-image of which center is shifted from an optical axis of optical system of said illumination optical apparatus.

32. A method of fabricating a semiconductor device using an illumination optical apparatus according to claim 29, said method comprising the steps of:

guiding a light from said illumination apparatus to a mask on which a predetermined circuit pattern is formed and illuminating the pattern; and with moving said mask and photo-sensitive substrate in predetermined directions respectively, projecting said pattern of the mask on the sensitive substrate.

33. A scanning exposure apparatus comprising:

a light supply means for supplying a beam;

a light-source-image forming means for forming a plurality of light source images in a substantially linear arrangement, based on the beam from said light supply means;

an optical integrator having a plurality of lens elements for forming a plurality of light source images, based on the beam from said light-source-image forming means, said lens elements having a rectangular cross section, two sides adjacent to each other of said rectangular cross section being different in length, said lens elements having a same refracting power both in the direction of the longer side of the rectangular cross section and in the direction of the shorter side thereof;

a relay optical system disposed between said light-source-image forming means and said optical integrator, for making a position of the light source images formed by said light-source-image forming means conjugate with a position of the light source images formed by said optical integrator;

a condenser optical system for condensing the beam from said optical integrator to illuminate a surface of a reticle;

a reticle stage for moving said reticle in a direction parallel to said surface of reticle;

a wafer stage for carrying a wafer on which integrated circuits are to be formed, and moving said wafer in a direction parallel to a surface of said wafer; and a projection optical system disposed between said reticle and said wafer, for making a position at which said reticle is located conjugate with a position at which said wafer is located.

34. A scanning exposure apparatus according to claim 33, wherein said reticle stage moves said reticle in a direction perpendicular to an optical axis of said apparatus and along a short side of a rectangular configuration of each lens element of said optical integrator, and said wafer stage moves said wafer in a direction perpendicular to an optical axis of said apparatus and along a short side of a rectangular sectional configuration of each lens element of said optical integrator.

35. A scanning exposure apparatus according to claim 33, wherein said light-source-image forming means comprises an optical integrator having a plurality of lens elements arranged in at least one line.

36. A scanning exposure apparatus according to claim 35, wherein the ratio of height to width of said optical integrator of said light-source-image forming means along a plane perpendicular to an optical axis of said optical integrator is proportional to the ratio of longitudinal and transverse length of each lens element of said optical integrator for forming light source images based on the beam from said light-source-image forming means.

37. A scanning exposure apparatus according to claim 36, wherein said reticle stage moves said reticle in a direction perpendicular to an optical axis of said apparatus and along a short side of a rectangular configuration of each lens element of said optical integrator, and said wafer stage moves said wafer in a direction perpendicular to an optical axis of said apparatus and along a short side of a rectangular sectional configuration of each lens element of said optical integrator.

38. A method of fabricating a semiconductor device using a scanning exposure apparatus according to claim 37, said method comprising the steps of:

guiding a light from said condenser optical system to said reticle to illuminate said reticle; and with moving said reticle and said wafer stage in predetermined directions respectively, projecting a pattern of the reticle on said wafer to perform the exposure.

39. An illumination optical apparatus according to claim 33, further comprising: a conversion member for converting plural light-source-images formed by said optical integrator into a light-source-image having a ring shape or a light-source-image of which center is shifted from an optical axis of optical system of said illumination optical apparatus.

40. A method of fabricating a semiconductor device using a scanning exposure apparatus according to claim 33, said method comprising the steps of:

guiding a light from said condenser optical system to said reticle to illuminate said reticle; and with moving said reticle stage and said wafer stage in predetermined directions respectively, projecting a pattern of said reticle on said wafer to perform the exposure.

41. A scanning exposure apparatus comprising:

a light supply means for supplying a beam;

a light-source-image forming means for forming a plurality of light source images in a substantially linear arrangement, based on the beam from said light supply means;

an internal reflection type integrator having two reflection planes parallel to each other for forming a plurality of light source images, based on the beam from said light-source-image forming means, said internal reflection type integrator having a rectangular cross section, two sides adjacent to each other of said rectangular cross section being different in length;

a relay optical system disposed between said light-source-image forming means and said internal reflection type integrator, for making a position of the light source images formed by said light-source-image forming means conjugate with a position of the light source images formed by said internal reflection type integrator;

a condenser optical system for condensing the beam from said internal reflection type integrator to illuminate a surface of a reticle a reticle stage for moving said reticle in a direction parallel to said surface of reticle;

a wafer stage for carrying a wafer on which integrated circuits are to be formed, and moving said wafer in a direction parallel to a surface of said wafer; and a projection optical system disposed between said reticle and said wafer, for making a position at which said reticle is located conjugate with a position at which said wafer is located.

42. An illumination optical apparatus according to claim 41, further comprising: a conversion member for converting plural light-source-images formed by said optical integrator into a light-source-image having a ring shape or a light-source-image of which center is shifted from an optical axis of optical system of said illumination optical apparatus.

*43. A scanning exposure apparatus comprising:*

*an illumination optical system, an optical axis of said illumination optical system being substantially perpendicular to a rectangular area on a predetermined plane on which a mask is arranged, said illumination optical system comprising an internal reflection type integrator with an exit plane having a shape substantially equal to that of said rectangular area on said predetermined plane, and said illumination optical system illuminating said rectangular area with an illumination beam, and*

*a movable member arranged to relatively move said mask with respect to said slit area on said predetermined plane during scanning of said illumination beam on a substrate through said mask, and to hold said mask at a position on or near said predetermined plane.*

*44. An apparatus according to claim 43, further comprising a stop member arranged between said internal reflection type integrator and said predetermined plane and arranged to limit said illumination beam in said illumination optical system.*

*45. An apparatus according to claim 44, wherein said stop member is substantially arranged on a pupil plane of said illumination optical system.*

*46. An apparatus according to claim 44, wherein said internal reflection type integrator is arranged so that said exit plane substantially conjugates with a surface of said mask.*

*47. An apparatus according to claim 46, further comprising:*

*a projection optical system arranged between said predetermined plane and said substrate, a plurality of light source images formed by said internal reflection type integrator being substantially formed on a pupil plane of said projection optical system.*

*48. An apparatus according to claim 47, further comprising:*

*another movable member arranged in a position on or near an imaging plane of said projection optical system and movable independently of said movable member, said another movable member holding said substrate.*

*49. An apparatus according to claim 43, further comprising an optical device arranged on said optical axis in said illumination optical system, said optical device changing an intensity distribution of said illumination beam on a pupil plane of said illumination optical system.*

*50. An apparatus according to claim 49, wherein said optical device selectively forms a first intensity distribution having a decreased intensity portion on said optical axis, the intensity of which is lower than an intensity of a portion located outer thereof on said optical axis, and a second intensity distribution having an increased intensity portion on said optical axis, the intensity of which is higher than an intensity of a portion located outer thereof on said optical axis.*

*51. An apparatus according to claim 43, further comprising:*

*an optical integrator arranged at a position beyond an incident plane of said internal reflection type integrator; and*

*a relay optical system arranged between said internal reflection type integrator and said optical integrator.*

*52. An apparatus according to claim 51, wherein said optical integrator has a cross sectional shape different from that of said internal reflection type integrator.*

*53. An apparatus according to claim 43, wherein said internal reflection type integrator comprises a glass rod.*

*54. A scanning exposure apparatus comprising:*

*an illumination optical system arranged to illuminate a slit area on a predetermined plane on which a mask is arranged, with an illumination beam, an optical axis of said illumination optical system being substantially perpendicular to said slit area, and said illumination optical system comprising a fly-eye type integrator having a plurality of optical elements each of which has a cross sectional shape that is substantially equal to said slit area on said predetermined plane and an optical device which changes an intensity distribution of said illumination beam on a pupil plane of said illumination optical system; and*

*a movable member arranged to relatively move said mask with respect to said slit area on said predetermined plane during scanning exposure on a substrate with said illumination beam through said mask, and to hold said mask at a position on or near said predetermined plane.*

*55. An apparatus according to claim 54, wherein said slit area has a substantially rectangular shape and said movable member moves in a direction substantially perpendicular to a longitudinal direction of said slit area.*

*56. An apparatus according to claim 55, wherein said optical device comprises a stop member arranged between said fly-eye type integrator and said predetermined plane and arranged to limit said illumination beam in said illumination optical system.*

*57. An apparatus according to claim 56, wherein said stop member is substantially arranged on said pupil plane of said illumination optical system.*

*58. An apparatus according to claim 57, wherein said stop member comprises a plurality of aperture stops having shapes that are different among them, and said intensity distribution of said illumination beam on said pupil plane is changeable.*

*59. An apparatus according to claim 58, wherein said fly-eye type integrator is arranged so that an incident plane of said fly-eye type integrator substantially conjugates with a surface of said mask and one of said aperture stops is arranged adjacent to an exit plane of said fly-eye type integrator.*

*60. An apparatus according to claim 59, further comprising:*

*an projection optical system arranged between said predetermined plane and said substrate, a pupil plane of said projection optical system substantially conjugating with said exit plane of said fly-eye type integrator.*

*61. An apparatus according to claim 60, further comprising:*

*another movable member arranged in a position on or near an imaging plane of said projection optical system, and movable independently of said movable member, said another movable member holding said substrate.*

*62. An apparatus according to claim 61, further comprising:*

*an optical integrator arranged at a position beyond said incident plane of said fly-eye type integrator; and*

*a relay optical system arranged between said fly-eye type integrator and said optical integrator.*

*63. An apparatus according to claim 62, wherein said optical integrator has an external form substantially equal to a cross section shape of said fly-eye type integrator.*

*64. A scanning exposure apparatus comprising:*

*an illumination optical system arranged to illuminate a slit area on a predetermined plane on which a mask is arranged, with an illumination beam, an optical axis of said illumination optical system being substantially perpendicular to said slit area on said predetermined plane, and said illumination optical system comprising an optical integrator arranged on said optical axis, which forms a plurality of light source images in which the number of light source images arranged in a first direction corresponding to a longitudinal direction of said slit area is different from a number of light source images arranged in a second direction crossing said first direction; and*

*a movable member arranged to relatively move said mask with respect to said slit area on said predetermined plane during scanning of said illumination beam on a*

*substrate through said mask, and to hold said mask at a position on or near said predetermined plane.*

*65. An apparatus according to claim 64, wherein said slit area has a substantially rectangular shape and said movable member moves in a direction substantially perpendicular to a longitudinal direction of said slit area.*

*66. An apparatus according to claim 65, wherein said optical integrator comprises fly-eye type integrators each of which has a plurality of optical elements having a cross sectional shape that is substantially equal to said slit area.*

*67. An apparatus according to claim 66, further comprising:*

*a projection optical system arranged between said predetermined plane and said substrate, said plurality of light source images being substantially formed on a pupil plane of said projection optical system.*

*68. An apparatus according to claim 67, further comprising:*

*another movable member arranged at a position on or near an imaging plane of said projection optical system, and movable independently of said movable member, said another movable member holding said substrate.*

*69. An apparatus according to claim 64, further comprising:*

*a second optical integrator arranged at a position beyond an incident plane of said optical integrator; and*

*a relay optical system arranged between said optical integrator and said second optical integrator.*

*70. An apparatus according to claim 69, wherein said second optical integrator has an external form different from an external form of said optical integrator.*

*71. An apparatus according to claim 70, wherein said optical integrator and said second optical integrator are fly-eye type integrators each of which has a plurality of optical elements, and each of said optical elements of said second optical integrator has a cross sectional shape different from a cross sectional shape of said optical integrator.*

*72. An apparatus according to claim 71, wherein each of said optical elements of said optical integrator has a cross sectional shape substantially equal to said slit area and said second optical integrator has an external form substantially equal to the cross sectional shape of each of said optical elements of said optical integrator.*

*73. An apparatus according to claim 69, further comprising:*

*a third optical integrator arranged at a position beyond an incident plane of said optical integrator; and*

*a second relay optical system arranged between said second and third optical integrators.*

*74. An apparatus according to claim 64, further comprising:*

*an optical device arranged on said optical axis in said illumination optical system, said optical device changing the intensity distribution of said illumination beam on a pupil plane of said illumination optical system.*

*75. An apparatus according to claim 74, wherein said optical device forms an intensity distribution having a decreased intensity portion on said optical axis, the intensity of which is lower than an intensity of a portion located outer thereof on said optical axis.*

*76. A scanning exposure method comprising the steps of:*

*illuminating a rectangular area on a predetermined plane on which a mask is arranged with an illumination beam emerging from an internal reflection type integrator, an exit plane of said internal reflection type integrator having a shape substantially equal to a shape of said rectangular area on said predetermined plane; and*

*relatively moving said mask and a substrate with respect to said illumination beam, respectively, to perform scanning exposure of said substrate with said illumination beam through said mask.*

*77. A device manufacturing method comprising a step of transferring a device pattern onto a work piece, wherein said transferring step comprises:*

*illuminating a rectangular area on a predetermined plane on which a mask is arranged with an illumination beam emerging from an internal reflection type integrator, an exit plane of said internal reflection type integrator having a shape substantially equal to a shape of said rectangular area on said predetermined plane; and*

*relatively moving said mask and said work piece with respect to said illumination beam, respectively, to perform scanning exposure of said work piece with said illumination beam through said mask.*

*78. A scanning exposure method comprising the steps of:*

*illuminating a slit area on a predetermined plane on which a mask is arranged with an illumination beam emerging from a fly-eye type integrator having a plurality of optical elements each of which has a cross sectional shape substantially equal to a shape of said slit area on said predetermined plane;*

*changing an intensity distribution of said illumination beam on a pupil plane of an illumination optical system that includes said fly-eye type integrator; and*

*relatively moving said mask and a substrate with respect to said illumination beam, respectively, to perform scanning exposure of said substrate with said illumination beam through said mask.*

*79. A method according to claim 78, wherein said slit area has a substantially rectangular shape and said mask is moved in a direction substantially perpendicular to the longitudinal direction of said slit area during said scanning exposure.*

*80. A device manufacturing method comprising a step of transferring a device pattern onto a work piece, wherein said transferring step comprises:*

*illuminating a slit area on a predetermined plane on which a mask is arranged with an illumination beam emerging from a fly-eye type integrator having a plurality of optical elements each of which has a cross sectional shape substantially equal to a shape of said slit area on said predetermined plane;*

*changing an intensity distribution of said illumination beam on a pupil plane of an illumination optical system that includes said fly-eye type integrator; and*

*relatively moving said mask and said work piece with respect to said illumination beam, respectively, to perform scanning exposure of said work piece with said illumination beam through said mask.*

*81. A scanning exposure method comprising the steps of:*

*illuminating a slit area on a predetermined plane on which a mask is arranged with an illumination beam emerging from an optical integrator, said optical integrator forming a plurality of light source images, in which the number of light source images arranged in a first direction corresponding to a longitudinal direction of said slit area is different from a number of light source images arranged in a second direction crossing said first direction; and*

*relatively moving said mask and a substrate with respect to said illumination beam, respectively, to perform scanning exposure of said substrate with said illumination beam through said mask.*

*82. A method according to claim 81, wherein said slit area has a substantially rectangular shape and said mask is moved in a direction substantially perpendicular to the longitudinal direction of said slit area during said scanning exposure.*

*83. A device manufacturing method comprising a step of transferring a device pattern onto a work piece, wherein said transferring step comprises:*

*illuminating a slit area on a predetermined plane on which a mask is arranged with an illumination beam emerging from an optical integrator, said optical integrator forming a plurality of light source images, in which the number of light source images arranged in a first direction corresponding to a longitudinal direction of said slit area is different from a number of light source images arranged in a second direction crossing said first direction; and*

*relatively moving said mask and said work piece with respect to said illumination beam, respectively, to perform scanning exposure of said work piece with said illumination beam through said mask.*

*84. A scanning exposure apparatus comprising:*

*an illumination optical system, an optical axis of said illumination optical system being substantially perpendicular to a slit area on a predetermined plane, said illumination optical system comprising an internal reflection type integrator on said optical axis and an optical device which changes an intensity distribution of an illumination beam on a pupil plane of said illumination optical system, and said illumination optical system illuminating said slit area with said illumination beam; and*

*a movable member arranged to relatively move a mask with respect to said slit area during scanning exposure on a substrate with said illumination beam through said mask, and hold said mask at a position on or near said predetermined plane.*

*85. An apparatus according to claim 84, wherein said optical device forms different intensity distributions of said illumination beam on said pupil plane of said illumination optical system.*

*86. An apparatus according to claim 85, wherein said optical device selectively forms a first intensity distribution having a decreased intensity portion on said optical axis, the intensity of which is lower than an intensity of a portion located outer thereof on said optical axis, and a second intensity distribution having an increased intensity portion on said optical axis, the intensity of which is higher than an intensity of a portion located outer thereof on said optical axis.*

*87. An apparatus according to claim 84, wherein the pupil plane has a center area and an outer area around the center area, and said optical device makes an intensity distribution increase in the outer area, in comparison with the intensity distribution in the center area of said pupil plane.*

*88. An apparatus according to claim 84, wherein said optical device makes an intensity distribution increase in a plurality of areas which are eccentric to said optical axis.*

*89. An apparatus according to claim 84, further comprising:*

*another optical integrator different from said internal reflection type integrator, said another optical integrator arranged within said illumination optical system.*

*90. An apparatus according to claim 89, wherein said another optical integrator comprises one of an internal reflection type integrator and a fly-eye type integrator.*

*91. An apparatus according to claim 84, further comprising:*

*a projection optical system having a pupil plane which substantially conjugates with an incident plane of said internal reflection type integrator.*

*92. An apparatus according to claim 91, further comprising:*

*another movable member arranged in a position on or near an imaging plane of said projection optical system and movable independently relative to said movable member, said another movable member holding said substrate.*

*93. A scanning exposure apparatus comprising:*

*an illumination optical system, an optical axis of said illumination optical system being substantially perpendicular to a slit area on a predetermined plane, said illumination optical system having a pupil plane including a center area and an outer area around the center area, said illumination optical system comprising a first optical integrator on said optical axis and an optical device which makes an intensity distribution increase in the outer area, in comparison with an intensity distribution in the center area of said pupil plane, and said illumination optical system illuminating said slit area with an illumination beam; and*

*a moveable member arranged to relatively move a mask with respect to said slit area during scanning exposure on a substrate with said illumination beam through said mask, and hold said mask at a position on or near said predetermined plane.*

*94. An apparatus according to claim 93, wherein said optical device makes the intensity distribution increase in a plurality of areas which are eccentric to said optical axis.*

*95. An apparatus according to claim 94, wherein said optical device is mounted so as to be able to be inserted into or removed from an optical path of said illumination optical system.*

*96. An apparatus according to claim 93, wherein said first optical integrator comprises an internal reflection type integrator having an exit plane with a shape substantially equal to said slit area.*

*97. An apparatus according to claim 96, wherein said optical device is substantially arranged on said pupil plane of said illumination optical system between said first optical integrator and said predetermined plane.*

*98. An apparatus according to claim 93, wherein said first optical integrator comprises a fly-eye type integrator having a plurality of optical elements each of which has a cross sectional shape substantially equal to said slit area.*

*99. An apparatus according to claim 98, wherein said optical device is arranged adjacent to said first optical integrator.*

*100. An apparatus according to claim 93, further comprising:*

*a second optical integrator different from said first optical integrator, said second optical integrator arranged within said illumination optical system.*

*101. An apparatus according to claim 100, wherein said second optical integrator comprises one of an internal reflection type integrator and a fly-eye type integrator.*

*102. An apparatus according to claim 100, wherein one of said first and second optical integrators is an internal reflection type integrator and the other is a fly-eye type integrator.*

*103. An apparatus according to claim 93, further comprising:*

*a projection optical system having a pupil plane which substantially conjugates with one of an incident plane and an exit plane of said first optical integrator.*

*104. An apparatus according to claim 103, further comprising:*

*another movable member arranged in a position on or near an imaging plane of said projection optical system and movable independently relative to said movable member, said another movable member holding said substrate.*

* * * * *